(12) United States Patent
Zur

(10) Patent No.: US 6,243,441 B1
(45) Date of Patent: Jun. 5, 2001

(54) ACTIVE MATRIX DETECTOR FOR X-RAY IMAGING

(75) Inventor: Albert Zur, Ganei Tikva (IL)

(73) Assignee: Edge Medical Devices, Raanana (IL)

( * ) Notice: Subject to any disclaimer, the term of this patent is extended or adjusted under 35 U.S.C. 154(b) by 0 days.

(21) Appl. No.: 09/352,124

(22) Filed: Jul. 13, 1999

(51) Int. Cl.⁷ ..................................................... H05G 1/64
(52) U.S. Cl. .................. 378/98.8; 378/98.7; 750/370.09
(58) Field of Search ................................ 370/98.8, 98.7, 370/98.2, 108; 250/394, 370.08, 370.09, 370.14

(56) References Cited

U.S. PATENT DOCUMENTS

| 5,084,911 | 1/1992 | Sezan et al. . |
| 5,313,066 | 5/1994 | Lee et al. . |
| 5,608,775 | 3/1997 | Hassler et al. . |
| 5,652,430 | 7/1997 | Lee . |
| 5,668,375 | 9/1997 | Petrick et al. . |
| 5,693,948 | * 12/1997 | Sayed et al. ..................... 250/370.09 |
| 5,751,783 | 5/1998 | Granfors et al. . |
| 6,148,060 | * 11/2000 | Collins et al. .......................... 378/68 |

* cited by examiner

Primary Examiner—David P. Porta
(74) Attorney, Agent, or Firm—Pillsbury Winthrop LLP

(57) ABSTRACT

This invention discloses a radiation imager including a plurality of radiation sensing elements operative to provide real-time radiation data and integrated radiation data, and circuitry coupled to the plurality of radiation sensing elements and providing readout of the real time radiation data and readout of the integrated radiation data and being operative to employ the integrated radiation data to provide a radiation image.

A method of radiation imaging including the steps of providing a radiation detection module underlying an object to be imaged, exposing the object to be imaged to radiation, and employing the radiation detection module to provide exposure data corresponding to the object at at least two different spatial resolutions is also disclosed.

43 Claims, 12 Drawing Sheets

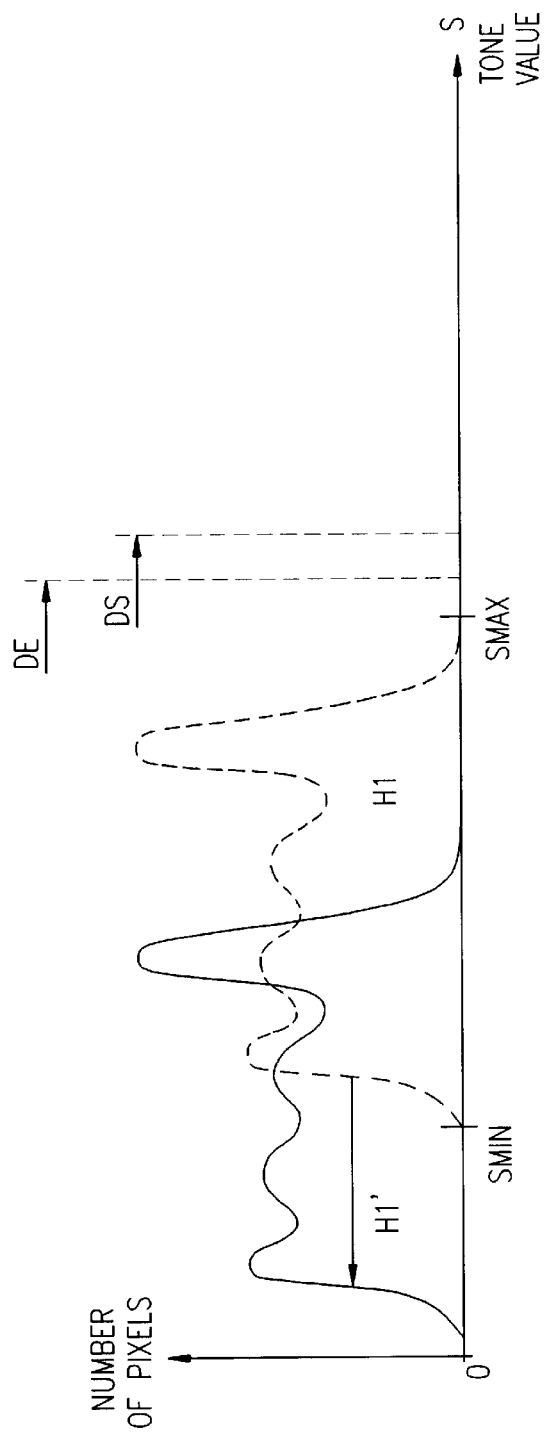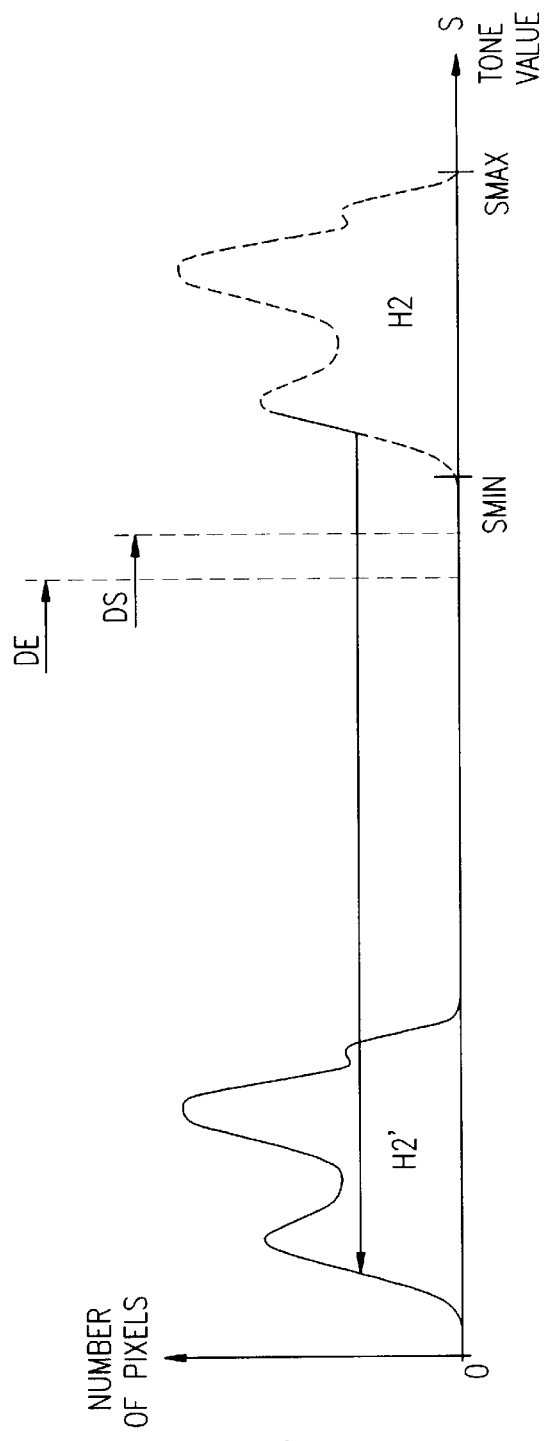
FIG. 5A
FIG. 5B

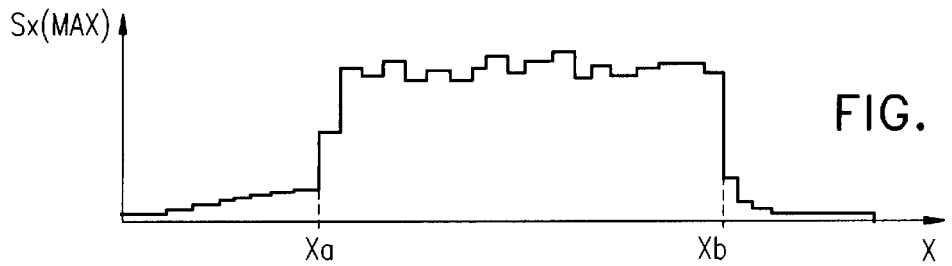
FIG. 12A
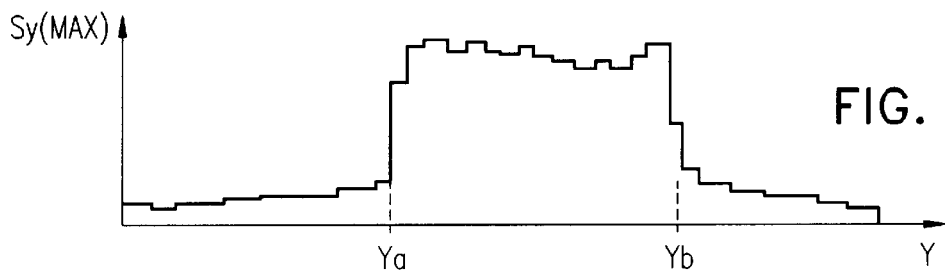
FIG. 12B
FIG. 12C
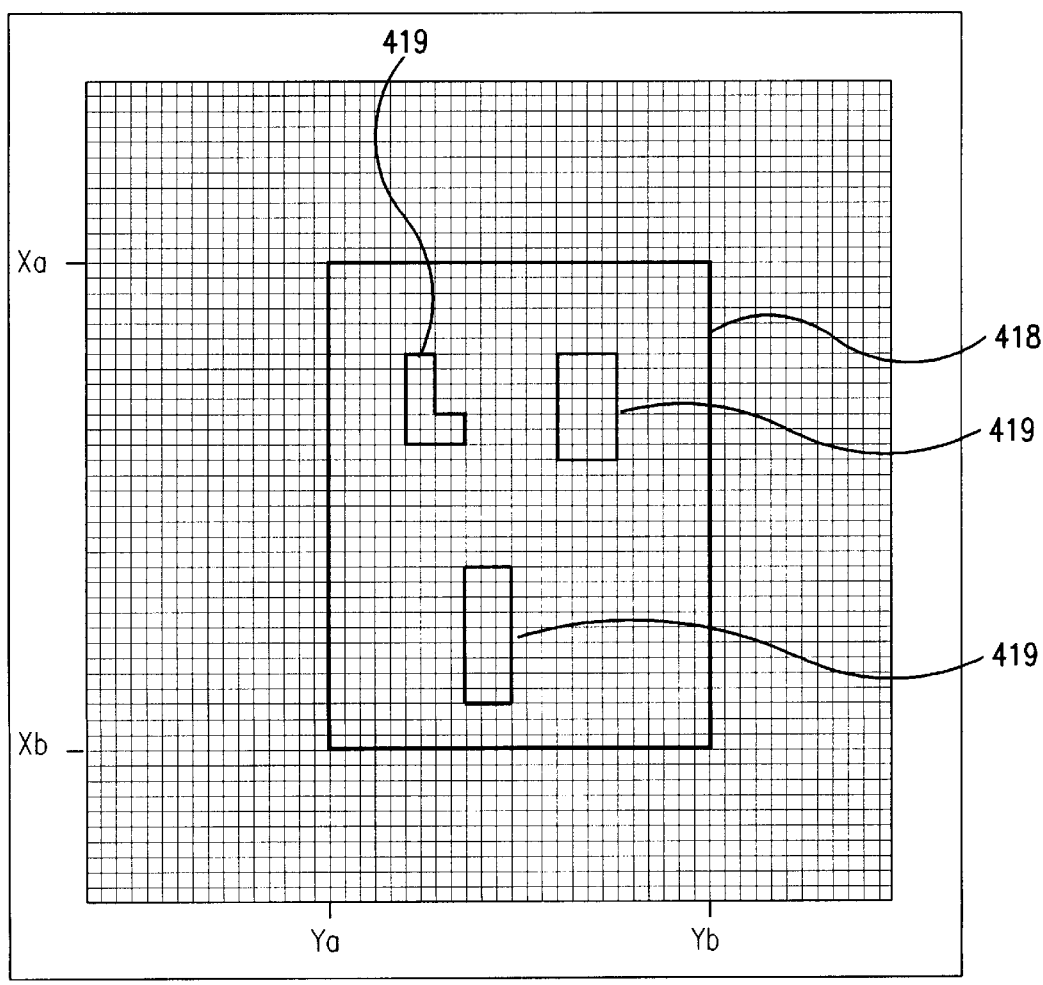

ACTIVE MATRIX DETECTOR FOR X-RAY IMAGING

FIELD OF THE INVENTION

The present invention relates to systems and methods in the field of radiation imaging and more particularly to a system and method for enhanced detection of X-ray images using an improved flat panel active matrix radiation detector.

BACKGROUND OF THE INVENTION

There are described in the patent literature numerous systems and methods for the recording of X-ray images. Conventional X-ray imaging systems use an X-ray sensitive phosphor screen and a photosensitive film to form visible analog representations of modulated X-ray patterns. The phosphor screen absorbs X-ray radiation and emits visible light. The visible light exposes photosensitive film to form a latent image of the X-ray pattern. The film is then chemically processed to transform the latent image into a visible analog representation of the X-ray pattern.

Recently, there have been proposed systems and methods for detection of static and or dynamic X-ray images. These digital X-ray systems and methods provide digital representations of X-ray images in which the X-ray image is recorded as readable electrical signals, thus obviating the need for film/screen in the imaging process. Digital X-ray systems typically rely on direct conversion of X-ray to charge carriers or alternatively indirect conversion in which X-ray is first converted to light which is then converted to charge carriers.

Direct conversion approaches typically use a X-ray sensitive photoconductor such as amorphous selenium overlying a solid state element which comprises a solid state array having thin-film-transistor (TFT) or diode addressing coupled to an array of storage capacitors. An example of a direct conversion approach is provided by US Pat. No. 5,313,066 to Lee et al., which describes an X-ray image capturing element comprising a panel having a layered structure including a conductive layer comprising a plurality of discrete accessible microplates and a plurality of access electrodes and electronic components built on the panel.

A further example of a direct conversion approach is U.S. Pat. No. 5,652,430 to Lee which describes a radiation detection panel made up of an assembly of radiation detector sensors arrayed in rows and columns where each sensor includes a radiation detector connected to a charge storage capacitor and a diode.

Indirect conversion approaches typically use a scintillating material such as columnar cesium iodide overlying a solid state active matrix array comprising photodiodes. The X-ray is converted to light by the scintillating material and the light is converted to charge by the photodiodes. An example of an indirect approach is provided by U.S. Pat. No. 5,668,375 to Petrick et al. which describes a large solid state X-ray detector having a plurality of cells arranged in rows and columns composed of photodiodes.

Direct and indirect conversion based digital X-ray detectors use charge storage matrices to retain imaging information, which is then electronically addressed, with stored charge read out subsequent to exposure. In dynamic imaging such as fluoroscopy, "real-time" images are simulated by repeatedly reading the integrated radiation values of the storage matrix to provide a sufficiently high number of frames per second, e.g. 30 frames per second. Image information, which is retained in the charge storage matrix, is not available until after the end of the X-ray pulse, since the detectors are operated in storage mode. Thus, measurements made from the current generation of digital detectors are not real-time.

For medical diagnosis, it is desirable to use the minimum X-ray exposure dose that will provide a good image having acceptable contrast and brightness for diagnostics. Different X-ray examinations, when performed on patients with a variety of body types, may require different doses to provide a good image for diagnostics. Thus, the dynamic range of a system suitable for all types of examinations may be as high as $10^4:1$.

The actual X-ray exposure dose for a specific X-ray examination may be selected using predetermined imaging exposure parameters and patient characteristics loaded from periodically updated lookup tables into a X-ray system console. Alternatively, the actual dose may be adjusted automatically using automatic exposure control devices, typically placed in front of the X-ray detector, to provide real-time feedback to the X-ray source.

Automatic exposure control devices, which must operate in real-time, typically make use of a multi-chamber ion chamber or a segmented phototimer as described in U.S. Pat. No. 5,084,911. These devices sense radiation impinging therethrough and provide a signal which terminates the X-ray exposure when a predetermined dose value, yielding a desired density level, has been reached.

Prior to exposure, the chamber or chambers to be used are selected by the X-ray technologist, and the patient or X-ray detector is aligned in accordance therewith. Disadvantages of exposure control devices include the fact that the real-time exposure signals are averaged over a fixed chamber area and do not directly correspond to the image information in a region of interest; the fact that devices in front of the detector cause non-uniform attenuation of the X-ray and some of the radiation that would otherwise contribute to signal in the detector is lost; the fact that the devices are typically bulky and require external power sources; and the fact that the spectral sensitivity of the devices differs from that of the radiation image detector being used thus requiring corrections and calibrations when the tube voltage (kVp) is varied.

Efforts have been made to incorporate real-time exposure control into digital X-ray detectors, particularly those directors based on the "indirect" conversion approach.

An example of apparatus for use in detecting real-time exposure information for an "indirect" scintillator based digital detector is described in U.S. Pat. No. 5,751,783 to Granfors et. al. This patent describes an exposure detection array of photodiodes positioned behind an imaging array of photodiodes. The exposure detection array which is a separate component, involving separate electronics, etc. is used to detect light which passes through the imaging array in certain regions due to gaps between adjacent pixels caused by the relatively low pixel fill factor. Pixels are regionally grouped to provide regional density measurements.

Alternatively, for digital X-ray imaging, special methods may be applied allowing digital detectors to sample the exposure prior to the imaging exposure using a two step method thus simulating real-time exposure information. An example of a two-step exposure method is a method for generating exposure information for a digital detector by first exposing the detector to a "calibrating" pulse in which an X-ray exposure of short duration produces an exposure in a solid state detector which is then processed to calculate the X-ray transparency of the object being imaged to calculate an optimum X-ray dose is described in U.S. Pat. No. 5,608,775 to Hassler et al.

SUMMARY OF THE INVENTION

There is thus provided in accordance with a preferred embodiment of the present invention, an integrated system for providing real-time and integrated exposure information for direct conversion based digital X-ray imaging detectors.

There is also provided in accordance with a preferred embodiment of the present invention a radiation imager including a plurality of radiation sensing elements operative to provide real-time radiation data and integrated radiation data, and circuitry coupled to the plurality of radiation sensing elements and providing readout of the real time radiation data and readout of the integrated radiation data and being operative to employ the integrated radiation data to provide a radiation image.

Further in accordance with a preferred embodiment of the present invention the plurality of radiation sensing elements includes at least one first grouping of the plurality of radiation sensing elements employed for real-time radiation sensing at at least one spatial resolution and at least one second grouping of radiation sensing elements employed for integration radiation sensing at at least another spatial resolution.

There is provided in accordance with yet another preferred embodiment of the present invention a radiation sensing device having a plurality of cells, each of the cells including a radiation sensor, a first output terminal, connected to the radiation sensor, which outputs real-time radiation data sensed by the radiation sensor, an input terminal, connected to said radiation sensor, which is employed to address the radiation sensor; and a second output terminal, connected to the radiation sensor, which outputs integrated radiation data sensed by the radiation sensor when addressed.

Further in accordance with a preferred embodiment of the present invention the plurality of cells are arranged in a matrix array having cluster, row and column connections and whereby the first output terminals of cells in a cluster are connected to a common cluster data output line, the addressing input terminals of cells in a row are electrically connected to a common row addressing line, and the second output terminals of cells in a column are connected to a common column data output line.

Still further in accordance with a preferred embodiment of the present invention the number of clusters is generally equal to the number of columns.

Additionally in accordance with a preferred embodiment of the present invention also including circuitry for data readout, and a solid state switch operative to select between data from the clusters and data from the columns.

Further in accordance with a preferred embodiment of the present invention, real-time radiation data is read out at a first spatial resolution concurrently from the cluster data output lines, and integrated radiation data is read out at a second spatial resolution from the common column data output lines via sequential row-by-row matrix addressing of the common row addressing lines. Additionally, the real-time radiation data is employed for automatic exposure control.

Still further in accordance with a preferred embodiment of the present invention the radiation sensed is ionizing radiation. Preferably the ionizing radiation is X-ray radiation.

There is further provided in accordance with a preferred embodiment of the present invention a solid state radiation imager including a plate electrode, a photoelectric conversion layer underlying the electrode and being operative to convert radiation passing through the plate electrode and impinging on the layer to charge carriers, a solid state active matrix array underlying the photoelectric conversion layer and including a plurality of pixel capacitors which are operative to accumulate the charge carriers, each pixel capacitor including an addressable microplate, and a segmented opposing electrode, control circuitry for selective addressing of the addressable microplates, and readout circuitry for sensing charge flowing to at least one segment of the opposing electrodes, thereby providing real-time exposure information, and sensing accumulated charge from addressed ones of the addressable microplates, thereby providing integrated radiation information associated with the radiation. Furthermore the real-time exposure information is generally imagewise and the real-time exposure information may be used to control termination of radiation exposure from said controllable X-ray source. Additionally the solid state radiation imager may also include a controllable X-ray source Further in accordance with a preferred embodiment of the present invention the segmented opposing electrodes are each divided into at least two different segments associated with at least two different capacitances and wherein the capacitance associated with the at least one segment from which charge flowing is sensed is one to two orders of magnitude smaller than the capacitance associated with other ones of the at least two segments.

Still further in accordance with a preferred embodiment of the present invention, the solid state radiation imager also includes switching low noise transistors, each operative to address one of the addressable microplates.

Additionally in accordance with a preferred embodiment of the present invention, the solid state radiation imager includes a diode in series with each switching low noise transistor and wherein the diode is operative generally to prevent excess charge accumulation at each pixel capacitor and to prevent circuitry breakdown.

Moreover in accordance with a preferred embodiment of the present invention, the solid state radiation imager also includes switching diodes, each operative to address one of the addressable microplates and generally to prevent excess charge accumulation at each pixel capacitor and to prevent circuitry breakdown. Additionally, the solid state radiation imager also includes a solid state selector for selecting whether charge flowing to the at least one segment of the opposing electrodes or accumulated charge from the addressed ones of the addressable microplates is sensed by the readout circuitry. Preferably the readout circuitry defines at least a first gain value for read out of charge flowing to at least one segment of the opposing electrodes and at least a second gain value for read out of accumulated charge from the addressed ones of the addressable microplates.

Furthermore the readout circuitry includes first dedicated readout circuitry operative for sensing charge flowing to at least one segment of the opposing electrodes and second dedicated readout circuitry operative for sensing accumulated charge from the addressed ones of the addressable microplates.

Further in accordance a preferred embodiment of the present invention the impinging radiation is ionizing radiation. Preferably the ionizing radiation is X-ray radiation.

Additionally in accordance with a preferred embodiment of the present invention the photoelectric conversion layer includes a photoconductor and charge blocking layers overlying and underlying the photoconductor, wherein the charge blocking layers may have opposing unipolar charge blocking characteristics.

Still further in accordance with a preferred embodiment of the present invention the photoconductor is formed of at least one of amorphous selenium and a selenium alloy. Additionally or alternatively the photoconductor is formed of a material selected from the group consisting of lead iodide, lead oxide thallium bromide, cadmium telluride, cadmium zinc telluride, cadmium sulfide, and mercury iodide.

Still further in accordance with a preferred embodiment of the present invention the solid state imager employs an adjustable reference bias potential to factor out a uniform component from the integrated charge accumulated at the plurality of pixel capacitors and the real-time exposure information is used to dynamically adjust the reference bias potential.

Additionally according to a preferred embodiment of the present invention the dynamic adjustment of the reference bias potential automatically factors out in real-time a DC component from a sensed radiation image thereby expanding the dynamic range of the solid state radiation imager. Additionally or alternatively the dynamic adjustment of the reference bias potential automatically provides tone scale remapping of the integrated radiation information.

There is further provided in accordance to a preferred embodiment of the present invention a method of radiation imaging including the steps of providing a radiation detection module underlying an object to be imaged, exposing the object to be imaged to radiation, employing the radiation detection module to provide exposure data corresponding to said object at at least two different spatial resolutions.

Further in accordance with a preferred embodiment of the present invention the step of providing exposure data at one of the at least two different spatial resolutions is carried out in real-time generally continuously during exposure.

There is further provided in accordance with a preferred embodiment of the present invention a method for image-wise radiation detection including the steps of providing a controllable ionizing radiation source, providing an image detection module having a plurality of sensing elements, positioning an object to be imaged between the controllable ionizing radiation source and the image detection module, exposing the object to be imaged to radiation emitted by the controllable ionizing radiation source, generally continuously providing real-time data from the plurality of sensing elements corresponding to radiation impinging on the image detection module during exposure, integrating data at the plurality of sensing elements to provide integrated data corresponding to an integrated level of radiation impinging on the image detection module, real-time processing of the real-time data to provide feedback to the image detection module, and processing the integrated data to provide a digital image representation corresponding to the object to be imaged.

Further in accordance with a preferred embodiment of the present invention the feedback is employed to provide a termination signal to the controllable ionizing radiation source, thus providing automatic exposure control. Additionally or alternatively the feedback is employed for factoring out a component from the integrated data which does not generally contain information relating to the object being imaged, thus providing an expanded dynamic range for the image detection module. Furthermore the factoring out step provides tone scale remapping of the integrated data. Additionally the factoring out step provides increased dark current tolerance for the image detection module.

Additionally in accordance with a preferred embodiment of the present invention the integrated data is not attenuated by the sensing of the real-time data.

There is also provided in accordance with yet another preferred embodiment of the present invention a method for detection of a generally rectangular irradiated field in an X-ray radiation image detection module and including the steps of providing an X-ray radiation sensor including an image pixel array arranged in rows and columns, searching the rows of the image pixel array to determine the maximum exposure value in a row, searching the columns of the image pixel array to determine the maximum exposure value in a column, creating a vector comprising the maximum exposure values of the rows, creating a vector including the maximum exposure values of the columns, and applying a dose normalized threshold discrimination criteria to analyze the vectors and determine the two rows and two columns whose intersection defines the generally rectangular irradiated field.

Further in accordance with a preferred embodiment of the present invention the rows and columns of the image pixel array being searched are rows and columns of macropixels wherein each macropixel includes a cluster of image pixels.

Still further in accordance with a preferred embodiment of the present invention the generally rectangular irradiated field is detected in real-time, and the generally rectangular irradiated field is preferably detected after exposure.

There is also provided in accordance with yet another preferred embodiment of the present invention a method for automatic exposure control in an X-ray system and including the steps of providing a radiation detector including an array of image pixels underlying an object to be imaged, irradiating the object to be imaged, detecting at the radiation detector in real-time an irradiated field spanning at least some of the image pixels, employing the detected irradiated field to determine at least one local region, generating a regional pixel map for each of the at least one local region, wherein each regional pixel map comprises exposure values of image pixels contained within the corresponding local region, and repeatedly analyzing the regional pixel maps using associated analysis criteria to determine timing for exposure termination, and providing an exposure termination signal.

Further in accordance with a preferred embodiment of the present invention the local regions, corresponding regional pixel maps and analysis criteria associated therewith are selected in accordance with a specific diagnostic examination.

There is also provided in accordance with a preferred embodiment of the present invention a method for enhanced detection of radiation images including the steps of providing a radiation image detector including an array of image pixels underlying an object to be imaged, irradiating the object to be imaged, detecting at the image detector in real-time an irradiated field spanning at least some of the image pixels, employing the detected irradiated field to determine a global pixel map comprising exposure values of image pixels contained within the irradiated field, repeatedly analyzing the global pixel map using associated analysis criteria to provide feedback to the radiation image detector, and employing the feedback for enhanced detection of radiation images.

Further in accordance with a preferred embodiment of the present invention the step of repeatedly analyzing the global pixel map includes the steps of repeatedly creating a histogram distribution of the number of pixels versus exposure values and imagewise analyzing of the histogram distribution. Preferably the feedback to the radiation image detector is employed to provide an exposure termination output.

BRIEF DESCRIPTION OF THE DRAWINGS

The present invention will be understood and appreciated more fully from the following detailed description, taken in conjunction with the drawings in which:

FIGS. 5A and 5B a graphical illustration of two different synthetic X-ray image histograms, before and after translation, respectively, representing examinations of two different anatomical regions of interest in a patient being imaged in accordance with a pre []d embodiment of the present invention;

FIGS. 12A and 12B are graphical illustrations useful in understanding the border detection steps in accordance with a preferred embodiment of the present invention; and FIG. 12C is an illustration of a global cluster of macropixels making up the irradiated field.

DETAILED DESCRIPTION OF PREFERRED EMBODIMENTS

Figure 1:
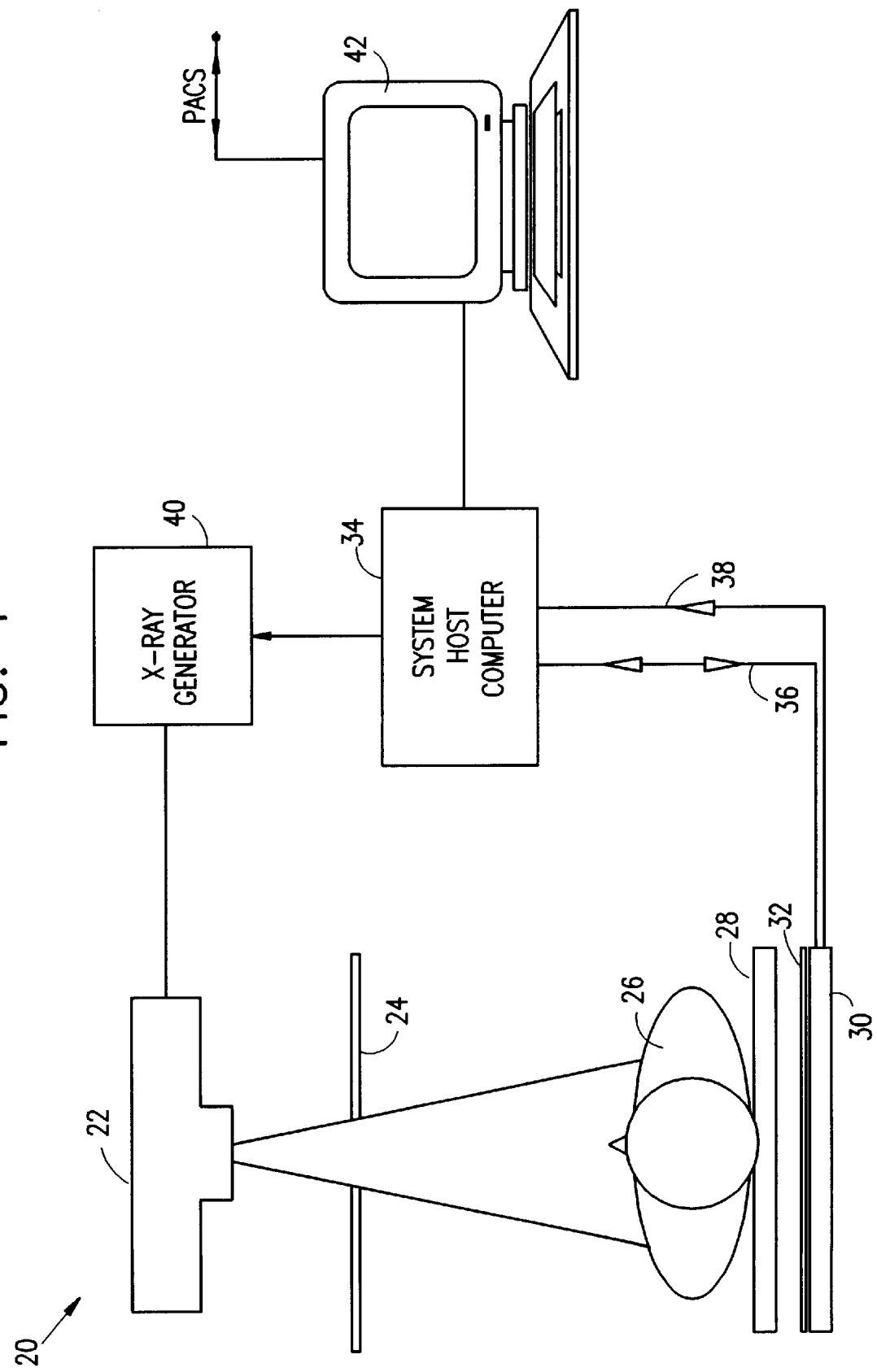
FIG. 1 illustrates a digital X-ray system incorporating an enhanced image detection module accordance with a preferred embodiment of the present invention.

Reference is now made to FIG. 1 which illustrates a digital X-ray system incorporating an enhanced image detection module in accordance with a preferred embodiment of the present invention.

FIG. 1 illustrates a digital X-ray imaging system 20, which includes an X-ray source 22 from which an X-ray beam is emitted. A collimator 24 preferably shapes the emitted X-ray beam. The X-ray beam preferably impinges upon a patient 26 preferably lying on or standing in front of a X-ray permeable patient support 28. The irradiation then impinges upon an image detection module 30, which is typically a flat panel digital X-ray detector including a direct converter of X-ray radiation to charge and a solid state active matrix for charge readout as described hereinbelow. The X-ray imaging system may include an anti-scatter grid 32 as known in the art.

Typically, the collimator 24 includes two sets of movable lead shutters which are arranged to restrict and shape the X-ray beam to define a desired irradiation field area which is typically rectangular. By restricting the irradiated field to a relevant region of the patient's anatomy, the overall dose of the X-ray to the patient may be reduced and X-ray image contrast is enhanced due to reduced scattering of primary X-ray radiation.

Preferably, the image detection module 30 is controlled by a system host computer 34 typically including a controller and data processor (not shown). A communications link 36, which may use a standard communications protocol such as USB, preferably connects the image detection module 30 to the system host computer 34 and is used for communication of control information. High speed data transfer from image detection module 30 to the data processor of system host computer 34 is preferably handled by a high speed data link 38 which may use an electrical or fiber optic link. Alternately, the high speed data link 38 may be wireless.

The controller of system host computer 34 preferably controls an X-ray generator 40 to set the exposure parameters of X-ray tube 22 such as tube voltage (kVp), tube current (milliamperes) and the maximum expected duration of an X-ray exposure pulse. These parameters are typically set in accordance with the requirements of a specific patient examination under operator control. In accordance with a preferred embodiment of the present invention, the actual duration of X-ray exposure is determined automatically as described hereinbelow.

In accordance with an alternative embodiment of the present invention, the exposure parameters of X-ray generator 40 may be input manually to a generator console (not shown).

Digital X-ray system 20 also preferably includes a monitor 42 which serves as an image display station and preferably also includes a user interface to the system operator.

It is appreciated that image detection module 30 may be used with digital X-ray systems for static X-ray imaging such as general radiography and mammography or alternatively for dynamic X-ray imaging such as fluoroscopy.

In the non-limiting example described herein, a general radiography system such as those sold by Philips Medical Systems International forms part of digital X-ray imaging system 20, which typically operates in the following manner:

Patient data is input to the monitor 42 and a type of examination that is to be carried out is preferably selected from an examination library. In accordance with the patient data and examination type, suggested exposure parameters are provided to a technologist (not shown) from look up tables, stored in a database of system host computer 34. Exposure parameters selected by the technologist are forwarded to the X-ray generator 40. Prior to exposure the technologist preferably positions the patient in front of or on the X-ray permeable patient support 28. The technologist then preferably adjusts the X-ray tube 22 collimator 24 to spatially define the irradiation field. Alternately, the collimator 24 may be automated, with sensing devices used to drive the lead shutters of the collimator into proper position.

After patient positioning, an X-ray exposure is initiated by the technologist using monitor 42 or by using a dedicated exposure switch (not shown). During patient exposure, the X-ray beam impinges on the patient and is spatially modulated as it passes through the patient anatomy. Thus a spatially modulated pattern which contains information relating to the patient's anatomy impinges on the image detection module 30. In accordance with a preferred embodiment of the present invention, exposure data is generated in real-time by image detection module 30 and transferred to the data processor of system host computer 34 through data link 38.

It is appreciated that the same data link 38 may be used for transfer of both integrated radiation data and real-time exposure data.

It is appreciated that the real-time exposure data is used to provide real-time dose control thus allowing dose optimization for each examination and eliminating inaccuracies resulting from imperfect registration and patient alignment relative to an automatic exposure control device in prior art methodologies. Moreover, instead of using prior art fixed aperture and fixed location density sensors typically associated with prior art phototimers and other exposure control devices, the present invention provides real-time exposure data which enables real-time image contrast feedback to be employed for optimized dose control as described hereinbelow. The present invention may thus enable a lowering of the dose required to reach desired diagnostic contrasts for a variety of different types of examination.

Additionally, in accordance with a preferred embodiment of the present invention, the real-time exposure data may be used to factor out, in real-time, a DC component of an emerging X-ray image for enhanced imaging.

Preferably, upon termination of patient exposure, raw image data comprising integrated radiation values representing a digital image is read out and transferred from image detection module 30 to the data processor of system host computer 34 via data link 38. The raw image data is preferably first calibrated and then image processed to provide a display on the monitor 42 corresponding to the object that was imaged, The digital image is preferably stored to or retrieved from a Picture Archiving and Communications System (PACS) via standard network communication preferably using the Digital Imaging and Communications in Medicine (DICOM) protocol as known in the art. Alternatively or additionally, digital images may be exported to a hard copy output device, such as a laser imager, to provide an image on film or any other suitable substrate.

Figure 2:
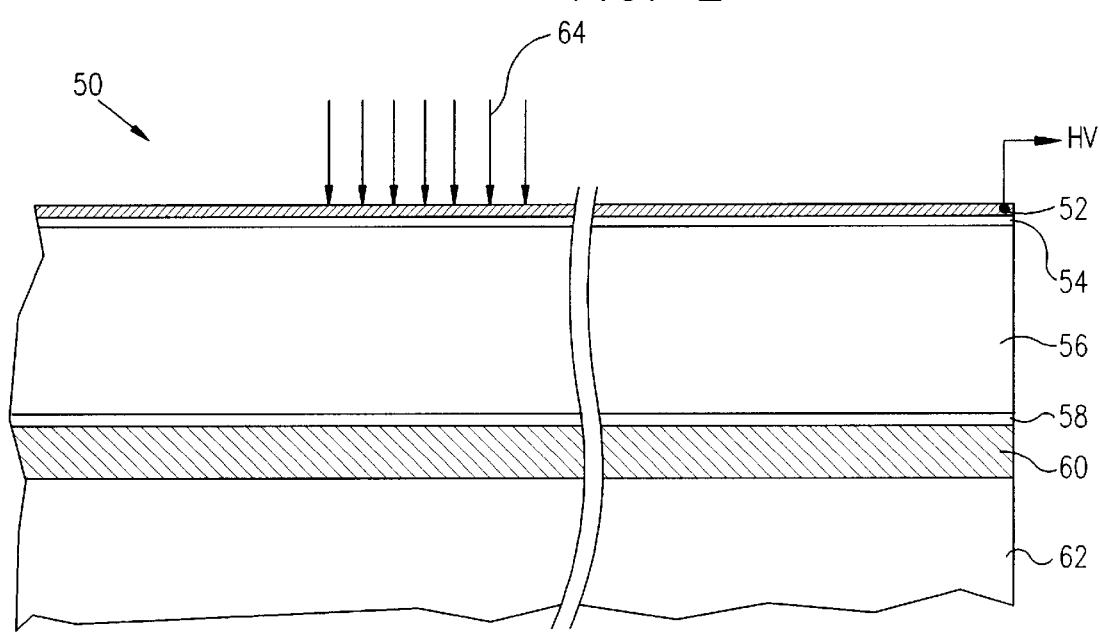
FIG. 2 is an illustration of an X-ray sensor array forming part of an image detection module of FIG. 1 in accordance with a preferred embodiment of the present invention.

Reference is now made to FIG. 2 which is an illustration of an X-ray sensor array 50 forming part of image detection module 30 of FIG. 1 in accordance with a preferred embodiment of the present invention.

It is appreciated that, in addition to the X-ray sensor array 50, image detection module 30 (FIG. 1) typically includes a light shielding casing (not shown) which is preferably EMI-RFI protected and which has at least one surface through which X-ray impinges on the X-ray sensor array 50. X-ray shielded readout electronics (not shown) are preferably coupled to the X-ray sensor array 50 at peripheral, non-active regions thereof. Connection of X-ray shielded readout electronics (not shown) to the X-ray sensor array 50 is preferably carried out using standard interconnect techniques such as TAB bonding and wire bonding as is well known in the art. Alternatively flexible interconnect boards may be employed to removably or permanently connect the X-ray sensor array 50 to the external readout electronics (not shown). Removable connections may use high density elastomeric zebra connectors, while permanent connections may use anisotropic conducting adhesive films. For the sake of simplicity and conciseness, only the X-ray sensor array 50 is shown herein.

X-ray sensor array 50 preferably is a multilayer structure which comprises, a layered stack having, from top to bottom, a top conductive layer 52, a first charge blocking layer 54, a photoelectric conversion layer 56, a second charge blocking layer 58, a solid state active matrix array 60 and a support substrate 62.

Top conductive layer 52 is preferably a continuous electrode formed of an X-ray permeable electrically conductive material such as indium tin oxide, chromium, gold, silver, copper or titanium and having a biasing electrical connection to an external high voltage power supply (not shown) which applies a bias voltage HV to top conductive layer 52.

Underlying top conductive electrode 52 is the first charge blocking layer 54 which preferably has unipolar blocking characteristics. Injection of charge carriers having the same polarity as the bias voltage HV from the top conductive layer 52 is blocked, while transit of opposite polarity charge carriers is not blocked and they may transit to top conductive layer 52 and be collected thereat.

When photoelectric conversion layer 56 is amorphous selenium, first charge blocking layer 54 may be formed of alkali doped selenium. Alternatively, the first charge blocking layer 54 may be a dielectric layer of submicron thickness having blocking characteristics for charge carriers of both polarities.

Photoelectric conversion layer 56 preferably has properties which make it suitable to act as a direct conversion X-ray sensing material. Upon sensitization thereof and following exposure thereof to incident radiation, the photoelectric conversion layer 56 generates a suitable number of extractable free electron hole pairs with preferably high charge carrier mobility and lifetime such that the mean free path of the charge carriers is greater than the desired layer thickness. In addition, photoelectric conversion layer 56 preferably exhibits generally high dark resistivity yielding a low dark current, allowing an electric field to be maintained thereacross during X-ray imaging. Furthermore, photoelectric conversion layer 56 is preferably characterized in that the density of charge carrier trap sites therein is low.

Photoelectric conversion layer 56 may comprise amorphous selenium, selenium alloys, lead iodide, lead oxide, thallium bromide, cadmium zinc telluride, cadmium sulfide, mercury iodide or any other suitable material that exhibits photoelectric X-ray sensitivity in the radiation spectrum of interest. Typically for medical imaging applications, the X-ray photon energy spectrum ranges from 18 to 150 keV.

It is appreciated that, due to its high dark resistivity, amorphous selenium is generally considered the material of choice for photoelectric conversion layer 56. However, it is a special feature of the present invention that materials having a higher dark current can be tolerated, without occupying an unacceptable portion of the dynamic range of the image detection module 30 (FIG. 1), by factoring out a DC component from the integrated radiation data as described in detail hereinbelow.

Preferably, the thickness of photoelectric conversion layer 56 is sufficient to allow absorption of at least 50% of the flux of the incident X-ray radiation as further described hereinbelow. For example, when using amorphous selenium or selenium alloys, the layer thickness required to achieve at least 50% absorption ranges from approximately 30 microns (at 18 keV) to 600 microns (at 150 keV). Thus, in accordance with the specific medical imaging application being used, for example mammography, general radiography or fluoroscopy, the thickness of photoelectric conversion layer 56 may range from 100 microns (mammography) to over 1000 microns (fluoroscopy) when amorphous selenium is employed.

Underlying photoelectric conversion layer 56 is the second charge blocking layer 58 which preferably has unipolar blocking characteristics. Injection of charge carriers having the opposite polarity of the bias voltage HV from the solid state active matrix array 60 is blocked, while transit of charge carriers having the same polarity as bias voltage HV is not blocked and they may transit to solid state active matrix array 60 and be collected thereat.

When photoelectric conversion layer 56 is amorphous selenium, the second charge blocking layer 58 having unipolar blocking characteristics may be formed of amorphous arsenic triselenide (a-As$_2$Se$_3$). Alternatively, the second charge blocking layer 58 may be a dielectric layer of submicron thickness having blocking characteristics for charge carriers of both polarities.

Solid state active matrix array 60 preferably comprises a plurality of addressable charge accumulating microplates, associated with charge storage capacitors, corresponding to image pixels. The dimensions of each microplate determines the sensing area of the pixel and the pixel fill factor. Preferably, the pixel fill factor is as high as possible. Addressable charge accumulating microplates and storage capacitor descriptions are as described hereinbelow with particular reference to FIGS. 6 and 8

Support substrate 62 preferably provides electrical insulation, mechanical support and dimensional stability for X-ray sensor array 50 and may serve as a base upon which solid state active matrix array 60 and layers 52–58 are formed. Support substrate 62 is preferably a glass panel, several millimeters thick (approximately 1 mm–5 mm), having a flat, generally flawless top surface. Examples of suitable materials for support substrate 62 are Corning glass 7059 and 1737. Depending on the overall size of the imaging area, support substrate 62 and solid state active matrix array 60 may comprise one panel or several panels tiled together.

During X-ray imaging, X-ray sensor array 50 is preferably sensitized and an electric field is maintained across photoelectric conversion layer 56 by applying a high bias voltage HV, on the order of hundreds up to several thousand volts, to top conductive layer 52 and by providing a different much lower bias voltage of the same polarity to the microplates (not shown) of solid state active matrix array 60.

Typically, the value of HV is selected in order to create a high, but sustainable, electric field across photoelectric conversion layer 56. For example, if photoelectric conversion layer 56 is amorphous selenium or a selenium-based alloy, HV preferably has a positive polarity and the desired field strength is in the range of 5–30 volts/micron, preferably 10 volts/micron, with a higher field strength providing increased sensitivity to X-ray radiation.

During exposure, X-ray radiation 64 is partially absorbed by photoelectric conversion layer 56, the absorbed radiation representing a transmission modulated X-ray image of an object (e.g. an anatomic region of the human body).

X-ray radiation photons, which are more energetic than the band gap of the X-ray sensitive material of photoelectric conversion layer 56, generate a number of free electron/hole pairs in photoelectric conversion layer 56, the total number of free carriers spatially corresponding to an image-wise X-ray pattern. The electric field which is present across photoelectric conversion layer 56 causes those generated electron/hole pairs which survive recombination to transit photoelectric conversion layer 56 in opposing directions along electric field lines which are generally perpendicular to the plane of photoelectric conversion layer 56.

The electric field is preferably sufficiently strong such that space charge effects are negligible and charge carrier transit occurs along straight field lines normal to the plane of photoelectric conversion layer 56, with virtually no sideways movement (lateral spread) of charge which could cause blurring or scattering and a corresponding reduction of image spatial resolution. Thus, generally high spatial resolution is typically maintained over photoelectric conversion layer 56, with minimal dependence on the layer thickness.

Since a bias voltage of a positive polarity is applied to top conductive layer 52 in the example shown, negative charge carriers generated in photoelectric conversion layer 56 move towards top conductive layer 52 and positive charge carriers generated in photoelectric conversion layer 56 move toward the microplates (not shown) of solid state active matrix array 60 and accumulate therein. Matrix addressing is then preferably used to transfer the accumulated charge resulting from X-ray absorption from the microplates (not shown) to external electronics (not shown) as described hereinbelow, thus providing a digital representation of the transmission modulated X-ray image.

It is appreciated that during exposure to radiation, image detection module 30 (FIG. 1) is always positioned relative to the object to be imaged such that impinging radiation passes through the object first and then impinges on the image detection module 30 (FIG. 1). It is appreciated that the underlying image detection module 30 (FIG. 1) may be positioned above or below the object to be imaged as long as it is downstream of the impinging radiation.

Figure 3:
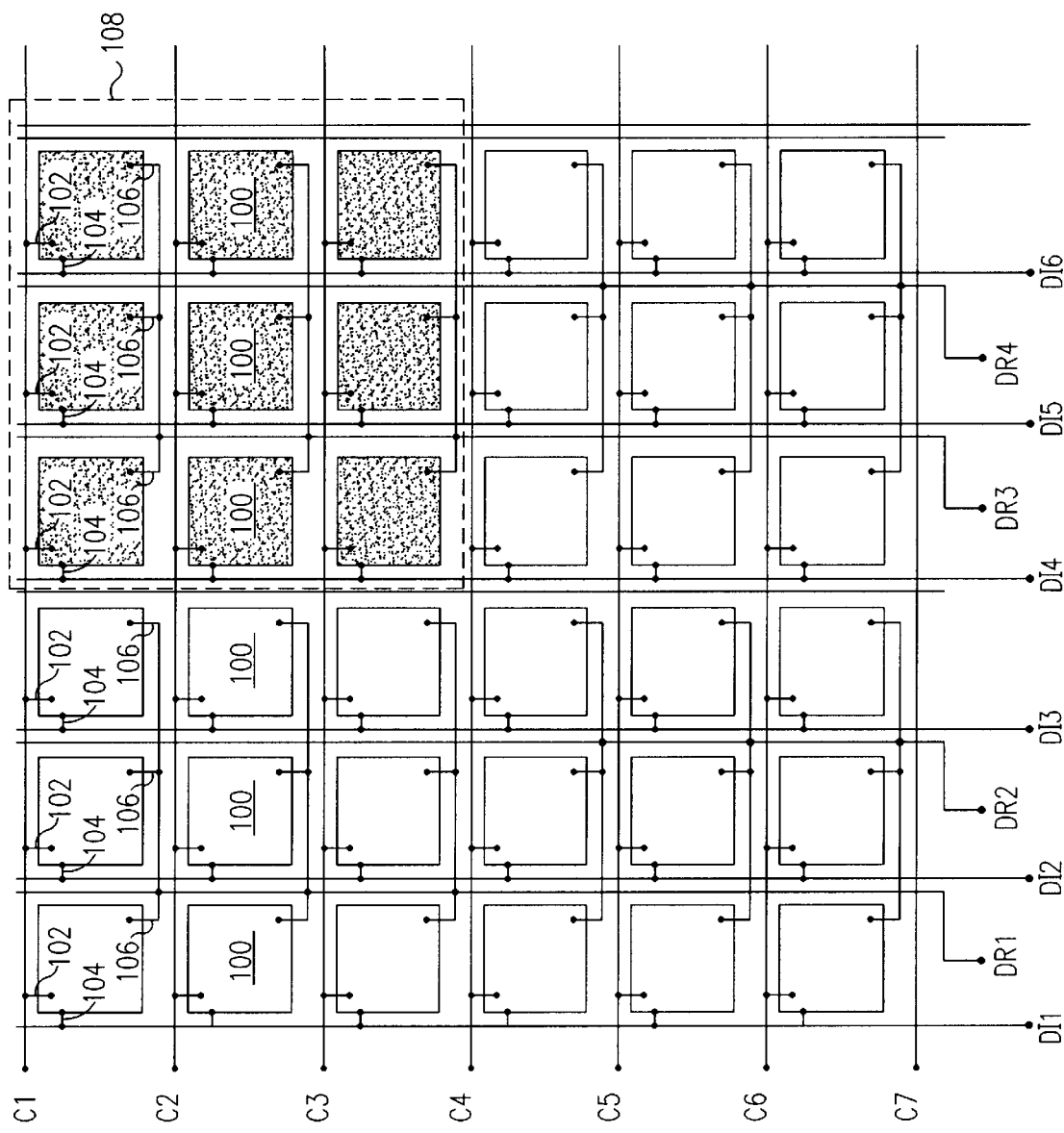
FIG. 3 is a schematic illustration of a region of a solid state active matrix array of FIG. 2 in accordance with a preferred embodiment of the present invention.

Reference is now made to FIG. 3 which is a schematic illustration of a region of the solid state active matrix array 60 of FIG. 2 in accordance with a preferred embodiment of the present invention.

Solid state active matrix array 60 (FIG. 2) preferably includes a plurality of discrete charge accumulating pixel elements 100 arranged in rows and columns which may define clusters of desired configurations. Each pixel element 100 preferably comprises a patterned multilayer structure including conductor layers, semiconductor layers and dielectric layers, which provide charge storage and pixel addressability. The structure and operation of the pixel element 100 is preferably as described hereinbelow with reference to FIGS. 6–9. External electronics, providing row-addressing and column readout, are preferably coupled to the solid state active matrix array 60 (FIG. 2) as described herein, with particular reference to FIG. 4. The structure and operation of the external electronics is preferably as described hereinbelow with reference to FIGS. 6–9.

In accordance with a preferred embodiment of the present invention, each pixel element 100 includes three I/O terminals: an addressing terminal 102, an integrated radiation data output terminal 104 and a real-time radiation data output terminal 106. It is appreciated that solid state active matrix arrays for X-ray imaging such as those described in the prior art, two I/O terminals are used—one for addressing and one for providing integrated radiation data output and there is no real-time radiation data output directly from the matrix array.

During integrated radiation data readout, a row of pixel elements 100 is typically addressed simultaneously by an addressing signal A (not shown) provided by a control line C to the addressing terminals 102 of the pixel elements 100 making up the row. Receipt of the addressing signal causes charge stored in pixel elements 100 to be output via integrated radiation data output terminals 104 and transferred via integrated data lines DI to external readout electronics (not shown). This results in reading of the stored charge value and resetting the pixel element 100. It is appreciated that the charge output via integrated radiation data output terminal 104 is an integrated charge value representing the total radiation exposure experienced by pixel element 100 during the time that has elapsed since the previous reset, as described hereinbelow with reference to FIGS. 6–9.

Control lines C are sequentially activated to read out information from rows of pixel elements 100 until a frame comprising all desired pixel elements 100 has been readout, resulting in the capture of an X-ray image and generation of a digital X-ray image corresponding thereto.

For dynamic imaging, high speed addressing is used to repeatedly read out frames of integrated charge values. Fluoroscopy, for example, requires a readout frequency of up to 30 frames per second. Since fluoroscopy typically requires lower resolution than static imaging, enhanced speeds may be achieved at the expense of decreased spatial resolution by binning pixel elements 100.

In accordance with a preferred embodiment of the present invention, independently of the integrated data readout, the real-time radiation data output terminal 106 of each pixel element 100 provides real-time charge flow information corresponding to real-time radiation impingement on that pixel element 100 which can be used to provide real-time data regarding the exposure. By definition, real-time radiation data is not provided through an addressing mechanism but instead is output directly during exposure. Preferably, a cluster of pixel elements 100 generally collectively provides real-time radiation data output in the form of charges representing the real-time radiation impingement at that cluster, via a common real-time data line DR. A plurality of clusters, thus output their respective real-time radiation impingement data, in the form of charges, via a corresponding plurality of respective data lines DR. The real-time data lines DR are coupled to readout electronics (not shown) for charge integration and sensing of imagewise real-time exposure information.

In the embodiment of FIG. 3, pixel cluster wiring and grouping are shown for the case where a cluster 108 comprises nine pixel elements 100. In this case, the spatial resolution of imagewise real-time radiation data is defined by macropixels each corresponding to a cluster 108 and comprising nine basic pixel elements 100. The actual number of pixel elements 100 making up one cluster is typically determined as described hereinbelow with reference to FIG. 4.

It is noted that the pixel grouping shown in FIG. 3, in which cluster wiring is routed around the perimeters of the pixels, is for the purposes of explanation only. Cluster wiring may be routed beneath the basic pixel elements 100 and may be implemented by a patternized conducting layer overlaid by a perforated dielectric layer which provides electrical insulation in non-perforated regions and electrical contact in perforated regions thereof.

It is appreciated that, in accordance with a preferred embodiment of the present invention, the real-time radiation data is provided without attenuating or interfering with the integrated radiation data as described hereinbelow with reference to FIGS. 6–7.

Providing real-time radiation sensing functionality in solid state active array matrix 60 obviates the need for external phototimers or automatic exposure control (AEC) apparatus and methods. Elimination of such apparatus enables reduction of the distance separating the detector from the object being imaged with correspondingly decreased image magnification. In addition, the combined functionality of solid state active array matrix 60 eliminates the need for calibration and correction which would otherwise be required to compensate for the differences in spectral sensitivities at different X-ray tube KVp values. Moreover, provision of real-time radiation sensing functionality provides enhanced imaging as described hereinbelow.

Figure 4:
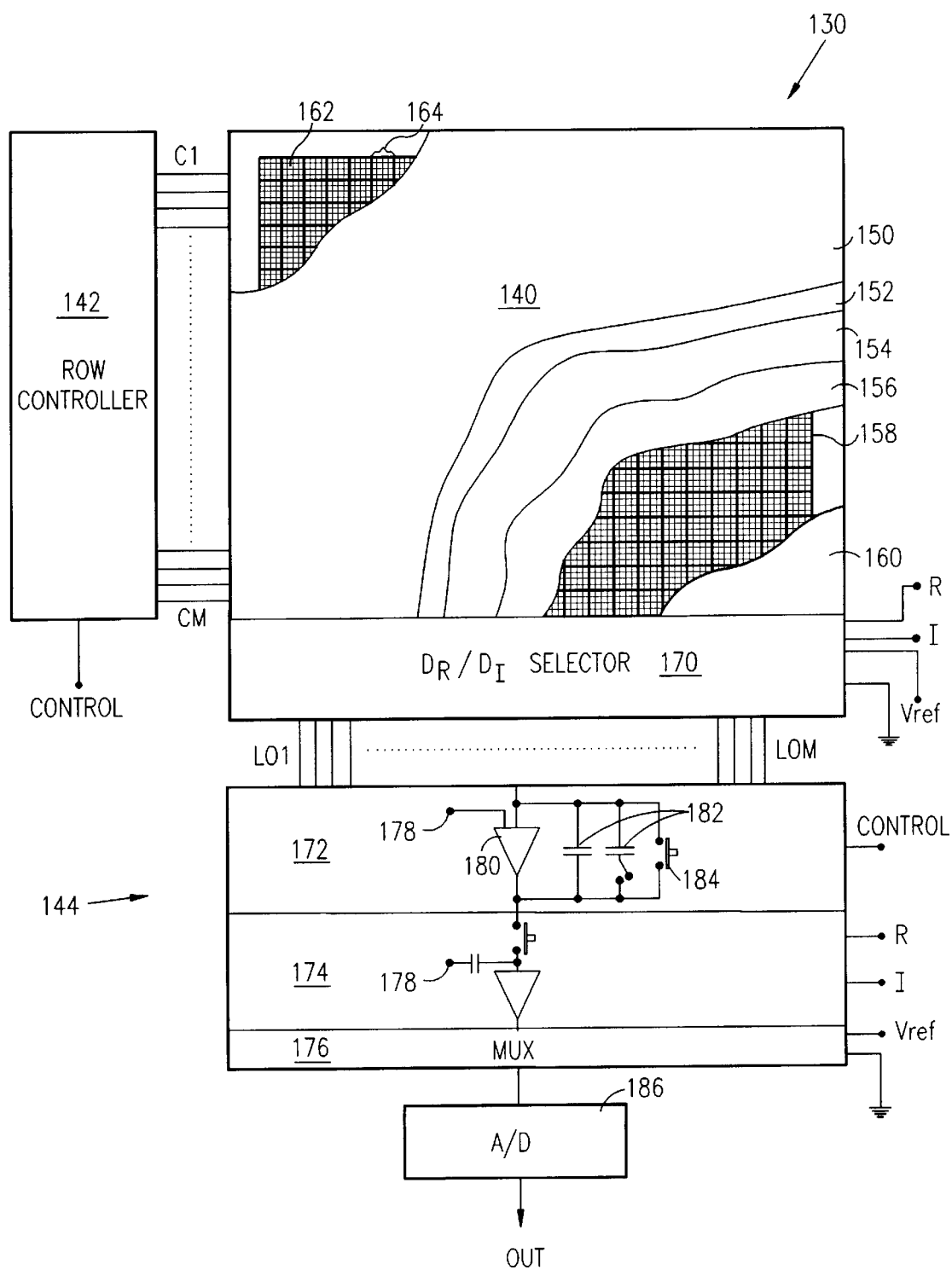
FIG. 4 a schematic illustration of an image detection module constructed and operative in accordance with a preferred embodiment of the present invention including a partially cut away pictorial illustration of an X-ray sensor array forming part thereof.

Reference is now made to FIG. 4 which is a schematic illustration of an image detection module 130 constructed and operative in accordance with a preferred embodiment of the present invention including a partially cut away pictorial illustration of an X-ray sensor array 140 forming part thereof.

The image detection module 130 may serve as image detection module 30 (FIG. 1). The X-ray sensor array 140, which may serve as X-ray sensor array 50 (FIG. 2), may be associated with a row controller 142 and readout electronics 144.

Preferably, X-ray sensor array 140 is a multilayer structure as described hereinabove with particular reference to FIG. 2, which comprises, from top to bottom, a layered stack having a top conductive layer 150, a first charge blocking layer 152, a photoelectric conversion layer 154, a second charge blocking layer 156, a solid state active matrix array 158 and a support substrate 160.

Top conductive layer 150 is preferably as described hereinabove with reference to top conductive layer 52 (FIG. 2), having a biasing electrical connection to an external high voltage power supply (not shown) which applies a bias voltage HV to top conductive layer 150.

The first charge blocking layer 152, photoelectric conversion layer 154, second charge blocking layer 156, solid state matrix array 158 and support substrate 160 are preferably as described hereinabove with reference to first charge blocking layer 54 (FIG., 2). photoelectric conversion layer 56 (FIG. 2), second charge blocking layer 58 (FIG. 2), solid state matrix array 60 (FIG. 2) and support substrate 62 (FIG. 2), respectively.

Preferably, solid state active matrix array 158 comprises a multitude of pixel elements 162 arranged in a matrix. Pixel elements 162 may serve as pixel elements 100 in the embodiment of FIG. 3.

In order to obtain an image detection module 130 suitable for general radiography, an imaging area of 17"×17" is typically used, with the dimensions of each pixel element 162 preferably in the range of 100–160 microns. The total number of pixel elements 162, arranged in a row-addressable M×M matrix is between 3000×3000 and 4500×4500 corresponding to between 3000 and 4500 readout channels.

For the purpose of real-time exposure sensing, basic pixel elements 162 may be clustered into macropixels 164. The number of macropixels 164, and thus the number of pixel elements 162 in each macropixel 164, is determined by taking into consideration the following factors: In imagewise real-time exposure sensing, it is preferable to maximize the number of macropixels 164 to provide more spatial information. However, when processing the obtained data in real-time as required for exposure control, the number of macropixels 164 is preferably limited, to reduce processing time. Furthermore, in order to increase the signal to noise ratio of real-time exposure data, relatively large macropixels are preferable.

Selection of a clustering scheme which provides a matrix with a total of M macropixels 164, e.g. between 3000 and 4500 macropixels, involves a tradeoff between a large number of macropixels required for imagewise real-time exposure sensing and the reduced number of macropixels 164 required for real-time data processing.

In accordance with a preferred clustering arrangement, each of M macropixels 164 includes M pixel elements 162. The macropixels 164 are arranged in the square root of M rows and the square root of M columns. For example, if the basic pixel element 162 is 100 microns in width, a 17"×17" imaging area typically includes an array of 4318×4318 basic pixel elements 162. The dimensions of each macropixel 164, which preferably includes 4318 pixel elements 162, is approximately 6.5 mm×6.5 mm, arranged in 65 rows and 65 columns.

During exposure, real-time radiation data is output, in the form of charges, from macropixels 164 via DR lines (FIG. 3), with each macropixel 164 being associated with a dedicated DR line (FIG. 3).

Real-time radiation data, in the form of charges, is preferably transferred from the DR lines, through a DR/DI selector 170, to readout electronics 144 via line output channels LO-1 through LO-M where it is integrated to provide real-time exposure data. It is appreciated that the number of DR lines (FIG. 3) and the number of DI lines (FIG. 3) are preferably equal to the number of macropixels 164.

DR/DI selector 170 is controlled via inputs R and I which determines whether integrated radiation data, in the form of charges, from DI lines (FIG. 3) or real-time radiation data, in the form of charges, from DR lines (FIG. 3) is transferred to line output channels LO-1 to LO-M. DR/DI selector 170 is preferably composed of a linear array of M distinct solid state switches as described hereinbelow with particular reference to FIGS. 6 and 8. Each switch connects either a DR line or a DI line to a corresponding LO line. The operation and basic architecture of DR/DI selector 170 are preferably as described hereinbelow with particular reference to FIGS. 6 and 8.

Preferably, DR/DI selector 170 is an integral part of solid state active matrix array 158 preferably implemented using the same solid state manufacturing technique that is used for producing solid state active matrix array 158. By incorporating the DR/DI selector 170 into the solid state active matrix array 158, the amount of external connections to readout electronics 144 remains low.

Alternatively, DR/DI selector 170 may be implemented by incorporating single crystal dedicated selector ASICs into solid state active matrix array 158 as by using chip on glass techniques known in the art. As a further alternative, DR/DI selector 170 may be implemented as part of the ASICs of readout electronics 144. These implementations are less desirable than the integral implementation described above since they require a greater number of external connections.

Returning to an explanation of readout from the X-ray sensor array 140, it is noted that real-time radiation data, in the form of charges, is preferably read out from macropixels 164 of X-ray sensor array 140 during X-ray exposure. Following termination of the X-ray exposure, a frame of integrated data, in the form of charges, is read out from pixel elements 162 by sequential row matrix addressing using row controller 142. Integrated data, in the form of charges, is transferred from the DI lines, through a DR/DI selector 170, to readout electronics 144 via line output channels LO-1 through LO-M.

It is appreciated that since real-time radiation data is preferably read out during exposure and integrated data is read out following exposure, readout electronics 144 may be shared and used for both read out of real-time radiation data and read out of integrated radiation data, thus simplifying image detection module 130.

Readout electronics 144 preferably include a cascade of multi-channel analog ASICS, with a total of at least M channels. Each multi-channel analog ASIC preferably includes a multichannel low noise charge amplifier stage 172, a multichannel analog sample and hold stage 174, and an analog multiplexer 176.

The readout electronics 144 preferably includes a floating common reference 178 which is switchably biased between ground and an adjustable potential Vref, which preferably ranges from a ground value to several tens of volts. The bias potential of floating common reference 178 appears on output channels LO-1 through LO-M.

Data, in the form of charges, from channels LO-1 to LO-M preferably flows in parallel to the charge amplifier stage 172 where the charges are integrated. Preferably, each charge amplifier 180 includes a number of integrating capacitors 182 which corresponds to the number of gain levels desired for different modes of operation such as a first gain level for readout of integrated data and a second gain level for real-time data readout. In the embodiment shown in FIG. 4, two distinct values of integrating capacitors 182 are used.

Each charge amplifier 180 in charge amplifier stage 172 preferably corresponds to a single channel which receives its data input via a line LO. The charge amplifier 180 preferably also includes a charge resetting switch 184 at its feedback. Charge amplifiers 180 are preferably jointly reset by a trigger provided by a controller (not shown) of image detection module 130.

Voltage values, corresponding to the charge integrated by each charge amplifier 180 between subsequent charge resets, are output in parallel to the multichannel analog sample and hold stage 174 and sampled thereby. The analog multiplexer 176 sequentially addresses the analog sample and hold stage 174, serially outputting analog data therefrom. The serial analog data output is converted to digital data by an A/D converter 186 with a resolution scale that is preferably between 8 and 14 bits. The resolution scale employed by the A/D depends on whether Vref is dynamically adjusted during readout as described hereinbelow. If Vref is adjusted then a relatively low resolution scale such as 8 bits A/D may be employed. Otherwise a higher resolution scale is preferably employed. Preferably, A/D converter 186 is also referenced to floating common reference 178.

The rate at which analog charge amplifier stage 172 is reset and the rate at which analog sample and hold stage 174 is sampled is determined by signals received from the controller (not shown) of image detection module 130. It is appreciated that the resetting and sampling rates may differ depending whether integrated data or real-time data is being read.

Real-time radiation data output, in the form of charges, along lines DR and read from all macropixels, provides generally imagewise real-time exposure information regarding image density and contrast which can be used as system feedback to provide improved automatic exposure control. Moreover, the imagewise real-time exposure information is analyzed to establish a dynamic Vref value, which can be useful in factoring out the DC component from the emerging X-ray image on-the-fly.

Reference is now made to FIGS. 5A and 5B which are histograms of X-ray images useful in understanding the determination of Vref and the operation of image detection module 130 (FIG. 4) in accordance with a preferred embodiment of the present invention.

FIGS. 5A and 5B shows two different synthetic X-ray image histograms H1 and H2, respectively, representing images of two different anatomical regions of interest in a patient. Each histogram H1 and H2 indicates for each tone value, the number of pixels in an image area having that tone value. As known in the art, anatomical regions of interest are typically associated with a characteristic histogram configuration.

It is a particular feature of the present invention that histograms of emerging X-ray images are analyzed on the fly using real-time exposure data and real-time processing to provide an effective expansion of the dynamic range of the image detection module 130 (FIG. 4) and automatic tone scale remapping. In addition, in accordance with a preferred embodiment of the present invention, on-the-fly histogram analysis is used to provide automatic exposure control.

The dynamic range of the image detection module 130 (FIG. 4) is determined by noise, at the low end of the dynamic range, and saturation, at the high end of the dynamic range.

At its high end, the dynamic range is determined by the lesser of the maximum signal detectable by the X-ray sensor array 140 (FIG. 4) before saturation as indicated by vertical dashed line DS and or the maximum signal detectable by the readout electronics 144 (FIG. 4) before saturation as indicated by vertical dashed line DE. The low end of the dynamic range is determined by the greater of the noise associated with the X-ray sensor array 140 (FIG. 4) or readout electronics 144 (FIG. 4).

The histogram H1 shown in FIG. 5A represents an image having a maximum tone value below the saturation values DS and DE which would have thus been detectable by the image detection module 130 (FIG. 4), while the histogram H2 shown in FIG. 5B is beyond the saturation values DS and DE and thus would not have been detectable without implementation of effective dynamic range expansion in accordance with the present invention.

In accordance with a preferred embodiment of the present invention, real-time exposure data is analyzed on the fly preferably using an algorithm as described hereinbelow with reference to FIGS. 10 and 11 to determine the minimum tone value of the histogram.

The minimum tone value of the histogram is used to create a feedback signal which adjusts Vref (FIG. 4) during exposure thus having the effect of continuously shifting the histogram of the emerging X-ray image leftward towards the graph origin resulting in translated histograms H1' and H2' as seen in FIGS. 5A and 5B, respectively.

Translation of the histogram represents a factoring out of a DC component from the X-ray image. The DC component does not contribute any imaging information; rather, it occupies part of the dynamic range of image detection module 130 (FIG. 4). Dynamically adjusting Vref attenuates the DC component of the emerging X-ray image thus allowing an expansion of the dynamic range of the image detection module 130 (FIG. 4) while utilizing readout electronics 144 (FIG. 4) having a relatively low dynamic range as indicated by vertical dashed line DE. This enables the use of relatively less expensive and lower-noise readout electronics 144 (FIG. 4).

It is appreciated that expansion of the effective dynamic range of the radiation detection by up to one order of magnitude is possible in accordance with the present invention. In addition, histogram translation provides an automatic tone scale remapping function thereby bringing the contrast of the X-ray image to a preferred scale for readout and post-processing. By providing tone scale remapping as described herein, the resolution scale of the A/D converter 186 (FIG. 4) can be maintained as low as 8 bits without losing any tone information.

In accordance with an alternative embodiment of the present invention, Vref may have a fixed, static value, before, during and after exposure. In this case, the effective dynamic range of the image detection module 130 (FIG. 4) is not expanded and automatic tone scale remapping does not occur.

Alternatively, Vref may be fixed before and during exposure and then adjusted to a suitable value after exposure during readout of integrated data. In this case, the dynamic range of X-ray sensor array 140 (FIG. 4) represented by vertical dashed line DS remains fixed and is not expanded, but the dynamic range of the image detection module represented by DE is expanded up to the limit established by DS. In this case, automatic tone scale remapping for image readout and post-processing does occur.

Figure 6:
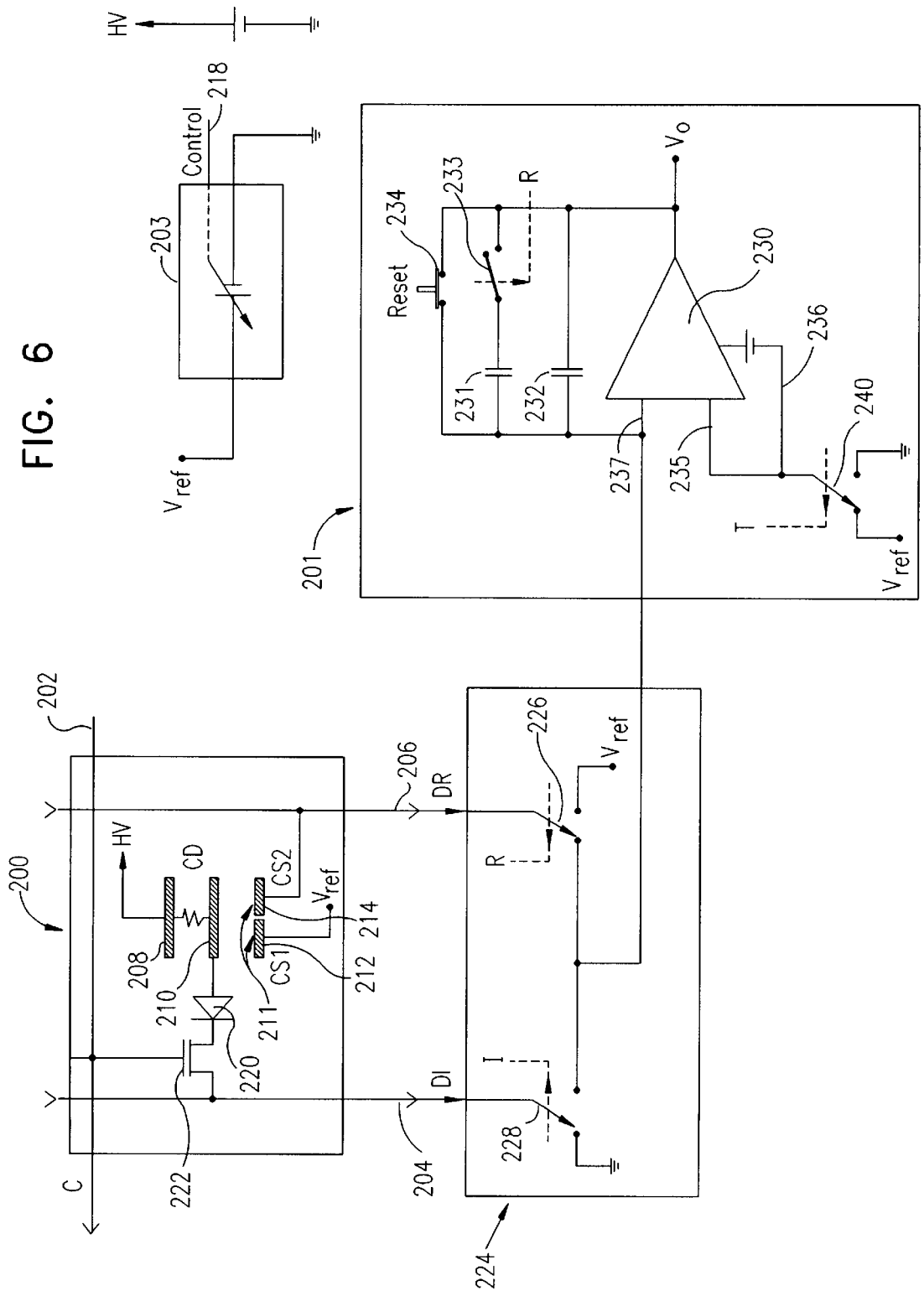
FIG. 6 is a schematic circuit diagram of a basic pixel element and readout electronics associated therewith in accordance with a preferred embodiment of the present invention.

Reference is now made to FIG. 6, which is a schematic circuit diagram of a basic pixel element 200 and channel readout electronics 201 as well as an adjustable power supply 203 useful therewith in accordance with a preferred embodiment of the present invention. Rows and columns of such pixel elements 200 as well as channel readout electronics 201 are incorporated in a typical X-ray sensor array constructed and operative in accordance with a preferred embodiment of the present invention, such as X-ray sensor array 50 (FIG. 2) of image detection module 30 (FIG. 1) or X-ray sensor array 140 (FIG. 4) of image detection module 130 (FIG. 4).

A basic pixel element 200, which may serve as pixel element 100 (FIG. 3) or pixel element 162 (FIG. 4), provides integrated radiation data and real-time radiation data in accordance with a preferred embodiment of the present invention. Each pixel element 200 preferably has three I/O terminals: an addressing terminal 202, which may correspond to addressing terminal 102 of FIG. 3, an integrated data output terminal 204, which may correspond to integrated data output terminal 104 of FIG. 3, and a real-time radiation data output terminal 206, which may correspond to real-time radiation data output terminal 106 of FIG. 3.

A photoelectric conversion layer (not shown) which may correspond to photoelectric conversion layer 56 (FIG. 2) is disposed between an overlying continuous top electrode 208 which may correspond to top conductive layer 52 (FIG. 2), and a multiplicity of underlying microplates 210 each of which preferably corresponds to a single pixel. A capacitor CD is defined at each pixel between the continuous top electrode 208 and each microplate 210.

Each microplate 210 is associated with an opposing electrode 211 and is spaced therefrom by a dielectric layer (not shown). Opposing electrode 211 is preferably a segmented electrode comprised of two distinct electrode 212 and 214. Electrode 212 is preferably connected to Vref, the value of which is determined by an adjustable external power supply 203, controlled by a control signal 218 in accordance with a real-time exposure data processing algorithm as described hereinbelow. It is appreciated that preferably a single external power supply 203 provides voltage Vref to the X-ray sensor array 50 (FIG. 2) or X-ray sensor array 140 (FIG. 4). Electrode 214 is preferably connected to line DR via real-time radiation data output terminal 206.

In accordance with an alternative embodiment of the invention, opposing electrode 211 may be a single, non-segmented electrode directly connected to line DR.

A pixel charge storage capacitor CS is defined between microplate 210 and opposing electrode 211. Preferably, and when two distinct electrodes 212 and 214 are used for opposing electrode 211, such as in the example shown, pixel charge storage capacitor CS comprises two distinct capacitors CS1 and CS2, respectively.

The relationship between capacitors CS and CD is preferably as follows: CS is two to three orders of magnitude greater than CD. When the capacitance of CS is divided between CS1 and CS2, CS2 is preferably one to two orders of magnitude smaller than CS1 and is specifically selected in accordance with the macropixel clustering plan described hereinabove with particular reference to FIG. 4 and the desired gain of real-time data readout as described hereinbelow.

A diode 220, which is preferably a low noise switching diode, and a transistor 222, which is preferably a low noise switching transistor such as a field effect transistor, are connected in series to microplate 210. During integrated charge readout as described hereinbelow, an addressing signal A is provided along control line C to transistor 222 in order to address microplate 210 causing charges accumulated thereat to be output through integrated radiation data output terminal 204.

A plurality of pixel elements 200 typically forms a part of a solid state active matrix array of an X-ray sensor array, such as solid state active matrix array 60 (FIG. 2) of X-ray sensor array 50 (FIG. 2) or solid state active matrix array 158 (FIG. 4) of X-ray sensor array 140 (FIG. 4). The precise three-dimensional structure of pixel element 200 may be in accordance with the solid state manufacturing technology, which may be based on standard hydrogenate amorphous silicon (a-Si:H) or polysilicon technology and fabrication techniques as well known in the art, particularly in the field of flat panel displays. Alternatively, the pixel element 200 may be implemented based on solid state polycrystalline cadmium selenide Ce:Se technology and fabrication processes as known in the art.

He As a further alternative, pixel element 200 may be implemented based on solid state crystalline circuitry as known in the art such that the solid state active matrix array (not shown) includes a mosaic of inter-connected discrete solid state crystalline circuits, each comprising a plurality of pixel elements 200.

It is understood that each fabricating technology and facility may have a unique approach to implementing the electronic circuitry making up a pixel element 200. Thus, in accordance with the present invention, only the electrical structure of pixel element 200, and not the three-dimensional structure thereof, is discussed.

Lines DR and DI, which receive charge signals from macropixels and pixels respectively as described hereinabove with particular reference to FIG. 3, are coupled to a DR/DI selector 224 which may serve as DR/DI selector 170 of FIG. 4. DR/DI selector preferably includes solid state transistor switches 226 and 228 which receive control signals R and I, respectively, in order to determine whether real-time data from line DR or integrated data from line DI is transferred to channel readout electronics 201 which may represent a single channel of readout electronics 144 (FIG. 4).

Channel readout electronics 201 typically includes a charge amplifier 230 preferably having two integrating capacitors 231 and 232, which are used to provide two distinct gains. A solid state switch 233 is used to disconnect or connect integrating capacitor 231 from charge amplifier 230 in accordance with the desired gain as described below. Charge amplifier 230 is preferably reset using a reset switch 234. It is appreciated that more than two distinct gains may be provided by adjusting the number and value of integrating capacitors and switches.

An input 235 of charge amplifier 230, which is preferably a non-inverting input, is preferably connected to a floating common reference 236. A solid state switch 240, triggered by a signal T, is used to set the bias applied to the floating common reference 236.

An input 237 of charge amplifier 230, which is preferably an inverting input, either receives real-time radiation data, in the form of charges, from line DR or integrated radiation data, in the form of charges from line DI. In both cases, charge amplifier 230 provides an output voltage Vo thus providing data readout.

When line DI is connected to input 237, integrated radiation data is input to charge amplifier 230 and read out therefrom. Switch 240 is positioned such that the floating common reference 236 is biased to a ground potential. In addition, solid state switch 233 is open such that only integrating capacitor 232 is used.

When line DR is connected to input 237, real-time radiation data is input to charge amplifier 230 and read out therefrom. Switch 240 is in a state such that Vref is applied to the floating common reference 236. In addition, switch 233 is preferably closed so both integrating capacitors 231 and 232 are connected thus lowering the gain of the charge amplifier 230.

It is appreciated that each line DR carries data from a macropixel comprising a large number of pixels as described hereinabove with particular reference to FIG. 4. In order to prevent saturation of charge amplifier 230 when line DR is connected to input 237, the readout gain of real-time exposure data from lines DR must be reduced. Lowering the gain is achieved by segmenting opposing electrode 211 into two electrodes 212 and 214 thus dividing CS into two parts CS1 and CS2 as described above, by controlling the ratio between CS1 and CS2 as described above, and by sampling real-time radiation data from CS2 only. Also, the readout gain of charge amplifier 230 may be selected using switch 233 to further reduce the gain and to adjust the desired total readout gain of real-time data.

Channel readout electronics 201 is preferably implemented in ASICS as described hereinabove with particular reference to FIG. 4.

It is a special feature of the present invention that dynamically adjusting Vref as described herein allows channel readout electronics 201 with a relatively low dynamic range to be employed in an image detection module with a fairly high dynamic range. As described hereinabove, with particular reference to FIGS. 5A and 5B, the effective dynamic range of the image detection module may be one order of magnitude higher than that provided by its readout electronics, This enables relatively inexpensive low-noise readout electronics to be employed.

It is appreciated that, as described hereinabove with reference to FIG. 4, DR/DI selector 224 may be implemented as part of a solid state active matrix array or alternatively may be implemented as part of channel readout electronics 201.

Figure 7:
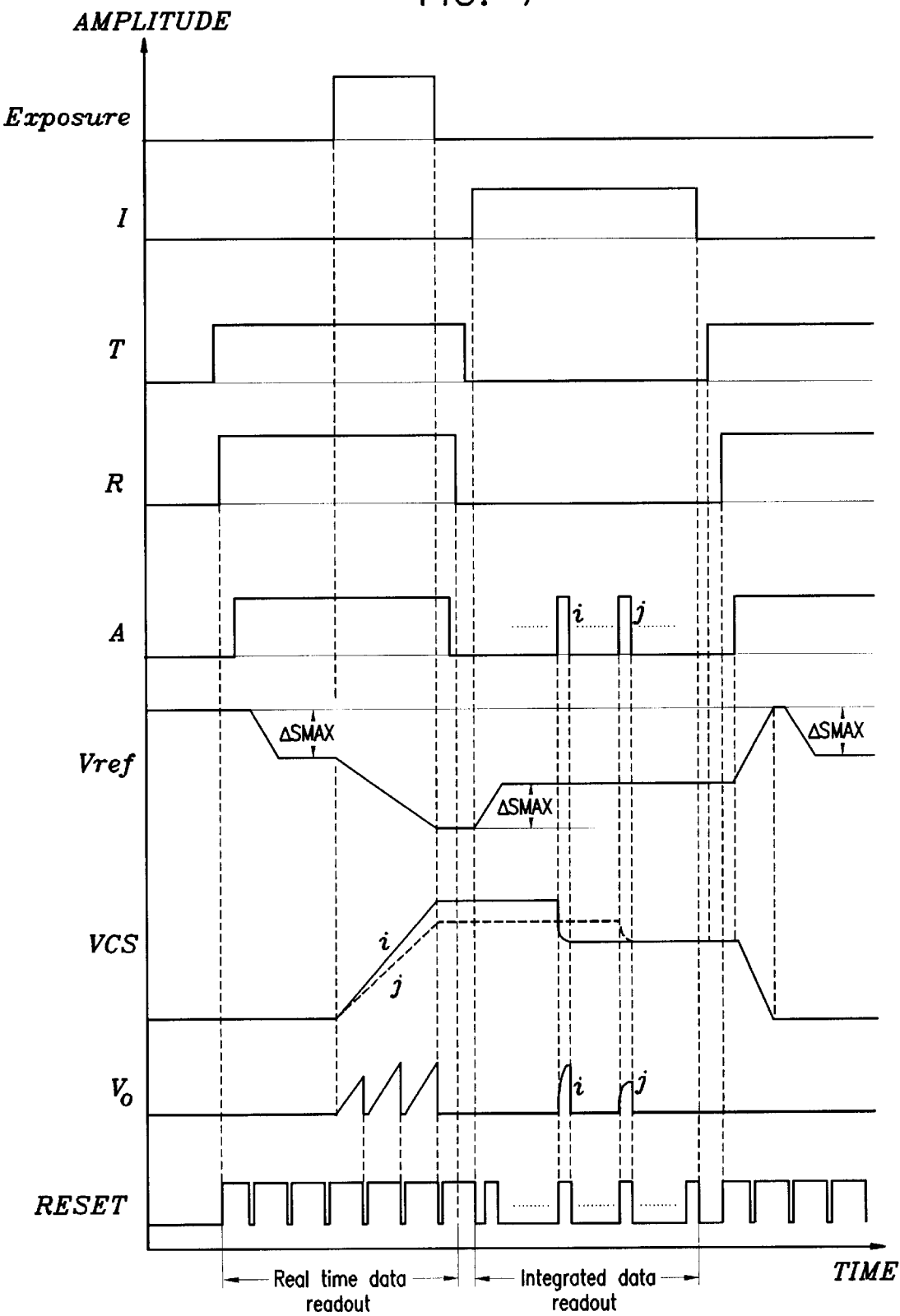
FIG. 7 is a timing diagram that demonstrates the operation of the pixel circuit of FIG. 6 during a readout cycle in accordance with a preferred embodiment of the present invention.

Reference is now made to FIG. 7 which is a timing diagram that demonstrates the operation of the pixel element 200 and channel readout electronics 201 of FIG. 6 during a readout cycle in accordance with a preferred embodiment of the present invention.

As indicated in FIG. 7, a readout cycle typically includes two readout stages: a real-time data readout stage, during which real-time radiation data, in the form of charges, is read out from lines DR; and an integrated data readout stage, during which a frame of integrated radiation data, in the form of charges, is read out from lines DI. It is appreciated that in order to provide a frame rate suitable for dynamic imaging applications such as fluoroscopy, all or part of the readout cycle may be repeated periodically at a suitably high rate such as 30 frames of integrated data per second.

Alternatively, for cases when radiation exposure is generally continuous as opposes to exposure pulses, such as with certain types of fluoroscopy, the transition from real-time data readout to integrated data readout may be at predefined time intervals.

It is appreciated that signals I, T, R, A and RESET preferably have an active state and a non-active state. For the explanations herein, the active state is referred to as "high" and the non-active state is referred to as "low".

As indicated in FIG. 6, a high DC voltage HV is applied to top electrode 208 as described hereinabove throughout both stages of the readout cycle.

As shown in FIG. 7, with reference to FIG. 6, prior to commencement of the real-time data readout, signal T goes high providing a trigger to switch 240 which causes the floating common reference 236, which is connected to input 235 of charge amplifier 230, to be connected to Vref.

Just after signal T goes high, at the onset of real-time data readout and following settling of the bias Vref at floating common reference 236, signal R goes high providing a trigger to switch 226 of DR/DI selector 224 thus connecting lines DR to input 237 of charge amplifier 230. Signal R also triggers switch 233 causing integrating capacitor 231 to be connected to charge amplifier 230 to provide an appropriate readout gain. Vref directly biases electrode 212 and also biases electrode 214 via charge amplifier 230. Thus, electrodes 212 and 214 are both biased to Vref during real-time data readout, while line DI is connected to ground via switch 228 of DR/DI selector 224.

After signal R goes high, signal A, applied to all control lines C of the X-ray sensor array 140 (FIG. 4), goes high, causing the transistor 222 of each pixel element 200 to be turned on fully discharging capacitor CS through diode 220 and transistor 222.

As seen in FIG. 7, a short time after signal A goes high thus causing full discharge of capacitor CS, Vref is ramped down from zero to a value of minus ΔSMAX. The value minus ΔSMAX is associated with the maximum signal range that can be read out by charge amplifier 230 as described hereinabove with particular reference to vertical dashed line DE of FIGS. 5A and 5B. As a result of the ramping down of Vref, diode 220 becomes reverse biased and non-conducting. Consequently, capacitor CD is then charged to a value which is approximately equal to HV plus the absolute value of Vref.

After Vref has ramped down and settled, the image detection module 30 (FIG. 1) is ready for radiation exposure. It is a particular feature of the present invention, that, as shown in FIG. 7, signal A applied to all control lines C, remains high until a short time after completion of radiation exposure, causing transistor 222 (FIG. 6) of each pixel element 200 in the X-ray sensor array to be on throughout exposure to radiation.

During radiation exposure, the potential VCS developed at capacitor CS continuously rises as described hereinbelow.

The radiation exposure causes electron/hole pairs to be generated within the photoelectric conversion layer as described hereinabove with particular reference to FIG. 2. Charge carriers that survive recombination are swept along field lines, with charges of one polarity transiting toward top electrode 208 and charges of the opposite polarity transiting toward microplate 210 thereby discharging capacitor CD. The amount of discharge of capacitor CD is a function of the exposure at the area of photoelectric conversion layer corresponding to microplate 210 and the level of dark current occurring thereat.

As a result of discharge of capacitor CD, charge redistribution occurs between top electrode 208 and electrodes 212 and 214, since a potential difference is maintained thereacross by HV and Vref. The charge redistribution causes each pixel storage capacitor CS, corresponding to each pixel element 200, to be charged to a potential VCS which corresponds to the radiation exposure and dark current at that pixel.

For the purpose of explanation, the potentials VCS of two distinct pixels i and j located in two different rows and exposed to different amounts of radiation are shown. It is seen that the potential VCS of pixel i rises faster and is greater than the potential VCS of pixel j thus indicating that pixel i was exposed to a greater amount of radiation than pixel j.

As is indicated by FIG. 7, simultaneous with the rises of potentials VCS, the value Vref is adjusted to an increasingly negative value by control signal 218 (FIG. 6) in accordance with an imagewise real-time exposure data processing algorithm as described hereinbelow. It is appreciated that charge redistribution at capacitor CS due to Vref variations is negligible since CD, which is significantly smaller than CS, acquires most Vref variations.

The use of a dynamic Vref value is a special feature of a preferred embodiment of the present invention. Adjusting the value Vref allows the maximum value of VCS at each pixel element 200, and thus the maximum amount of X-ray radiation that can be detected before saturation of the X-ray sensor array 140 (FIG. 4), to be dynamic and to be a function of the emerging X-ray image. Typically, high VCS potentials occur at pixels which receive high amounts of radiation, such as pixels that receive direct, unattenuated X-ray exposure. By adjusting Vref, the dynamic range of the X-ray sensor array 140 (FIG. 4) is increased.

In accordance with a preferred embodiment of the present invention, saturation of pixels of the X-ray sensor array 140 (FIG. 4) occurs only when the combined value, Vref+VCS of such pixels becomes positive relative to ground. At saturation, diode 220 of the saturated pixels becomes forward biased and begins conducting, causing excess charge accumulated on microplate 210 to be leaked and drained off through line DI.

An advantage of draining off excess charge through diode 220 while transistor 222 is on is that voltage overloads to active elements of pixel circuits are prevented. The problem of voltage overloads in pixel circuits is well known in the art and leads to transistor breakdown. U.S. Pat. No. 5,313,066 to Lee describes an embodiment which overcomes the problem of transistor breakdown by using a relatively thick dielectric layer disposed between an X-ray sensitive layer and an electrically conductive layer. It is appreciated that the described circuitry of FIG. 6 eliminates the problem of transistor breakdown without necessitating the thick dielectric layer which prevents dynamic imaging. Thus in accordance with a preferred embodiment of the present invention, a self-suppressing voltage overload mechanism for static and dynamic imaging is provided for each pixel element 200.

It is appreciated that, as indicated in FIG. 7, prior to exposure, Vref drops to a negative value equal to $\Delta$SMAX, which corresponds to the maximum charge signal that charge amplifier 230 can integrate without becoming saturated. Thus excess charge is only drained off when the amount of charge accumulated is beyond the saturation value of charge amplifier 230.

The output value of charge amplifier 230, Vo, generally corresponds to VCS and may be read out in the following manner:

Charging of capacitor CS to potential VCS, as a result of charge redistribution, causes charge to flow to and accumulate at electrodes 212 and 214, thus mirroring the charge which was swept to microplate 210 and accumulated thereat during exposure. Charge flowing to electrode 214, which is a sampling of the total charge flowing into CS, flows through charge amplifier 230. It is a particular feature of the present invention that the real-time radiation data is read from charge that flows to electrode 214 during charge redistribution and does not diminish the charge accumulated at charge storage capacitor CS. Thus, the integrated charge data forming the X-ray image, which is read out as described hereinbelow, is not diminished or interfered with by real-time exposure data readout.

Charge amplifier 230 integrates the charge flowing to electrode 214 and provides the output value Vo which corresponds to the real-time exposure value at a macropixel including a plurality of pixel elements 200 connected to a common line DR as described hereinabove.

Preferably, the output value Vo is reset by a RESET signal which triggers reset switch 234 at a predetermined rate which preferably remains fixed during real-time data readout and which is determined as described hereinbelow with particular reference to FIG. 10. Resetting the output value Vo prevents saturation of charge amplifier 230 during real-time data readout, thus allowing the same charge amplifier 230 to be used for readout of integrated data as well as readout of real-time radiation data.

Following the termination of exposure as shown in FIG. 7, signal A goes low causing transistors 222 of each pixel element 200 making up the X-ray sensor array to turn off thus becoming non-conducting.

After signal A goes low, signal R goes low causing switch 226 to change states thereby causing line DR to be disconnected from input 237 of charge amplifier 230 and to be connected directly to Vref. Signal R also triggers switch 233, disconnecting integrating capacitor 231 from charge amplifier 230, thus increasing the gain of charge amplifier 230.

After signal R goes low, signal T goes low, providing a trigger to switch 240 which causes floating common reference 236 to disconnect from Vref and to connect to ground.

Immediately after T goes low, integrated data readout starts. Signal I goes high providing a trigger to switch 228, causing line DI to be connected to input 237 of charge amplifier 230.

Subsequently and as indicated in FIG. 7, Vref is increased by an amount equal to $\Delta$SMAX, thereby causing diode 220 to be forward biased in preparation for row by row addressing and readout of the integrated data. It is appreciated that Vref remains fixed during the remainder of integrated data readout.

After Vref is increased and settled, signal A, applied to all control lines C, goes low. It is appreciated that, during integrated data readout, signal A, is sequentially applied to each control line C, providing row-by-row addressing. Signal A turns on transistor 222 of each pixel element 200 in an addressed row, enabling charge to be read out from the storage capacitors CS thereof as follows:

In addressed pixels, charge which accumulated at capacitor CS during exposure flows from microplates 210 to charge amplifier 230 via line DI. As a result of this charge flow, the potentials VCS of pixels in the addressed row fall until reaching the absolute settled value of Vref, beyond which diodes 220 become reverse biased and non-conducting, preventing further charge flow from microplates 210.Charge amplifiers 230 integrate the flowing charge and output corresponding Vo values.

It is appreciated that during integrated data readout, each output value Vo preferably corresponds to a single pixel.

As seen in FIG. 7, the row containing pixel i is addressed and integrated data of pixel i is readout therefrom and then the row containing pixel j is addressed and integrated data of pixel j is readout therefrom.

It is a particular feature of the present invention that the output value Vo represents only a fraction of the potential VCS. The remainder of potential VCS represents a DC component which does not bear any image information as described hereinabove with particular reference to FIGS. 5A and 5B. Charge associated with the DC component, which does not contribute image information is factored out. By factoring out the DC component, the histogram associated with the X-ray image is translated thus providing an automatic tone scale remapping function for the X-ray image being read as described hereinabove with reference to FIGS. 5A and 5B.

The RESET signal is a trigger for the reset of charge amplifier 230 which is provided during integrated data readout at a predetermined triggering rate. Typically the predetermined triggering rate is associated with the desired row addressing and frame readout rates and is different than the triggering rate used during real time data readout.

Charge is read out from all rows of the X-ray sensor array through sequential addressing to provide a frame of integrated data representing an X-ray image. After charge is read out from the final row, signal I goes low providing a trigger to switch 240 which causes line DI to be disconnected from input 237 of charge amplifier 230 and to be connected to ground.

After signal I causes disconnection of line DI, signal T goes high providing a trigger to switch 240 causing Vref to be connected to floating common reference 236.

After the Vref is settled at floating common reference 236, signal R goes high providing a trigger to switch 226 causing lines DR to be connected to input 237 of charge amplifier 230. Signal R also causes switch 233 to be closed thus reducing the gain of charge amplifier 230.

Signal A, applied to all control lines C, goes high causing the transistor 222 of each pixel element 200 of the X-ray sensor array 140 (FIG. 4) to be turned on.

Simultaneous with the rise in signal A, Vref is ramped up to zero causing diode 220 to be forward biased and conducting. Ramping up Vref causes full discharge of capacitor CS and reduction of VCS to its minimum value. It is appreciated that charge from CS, which is associated with the DC component and therefore was not read during integrated data readout, is leaked at this time from microplate 210 through diode 220 and conducting transistors 222 to ground along lines DI.

After full discharge of capacitor CS at each pixel element 200, the image detection module 30 (FIG. 1) is ready to enter a subsequent real time data readout cycle.

Figure 8:
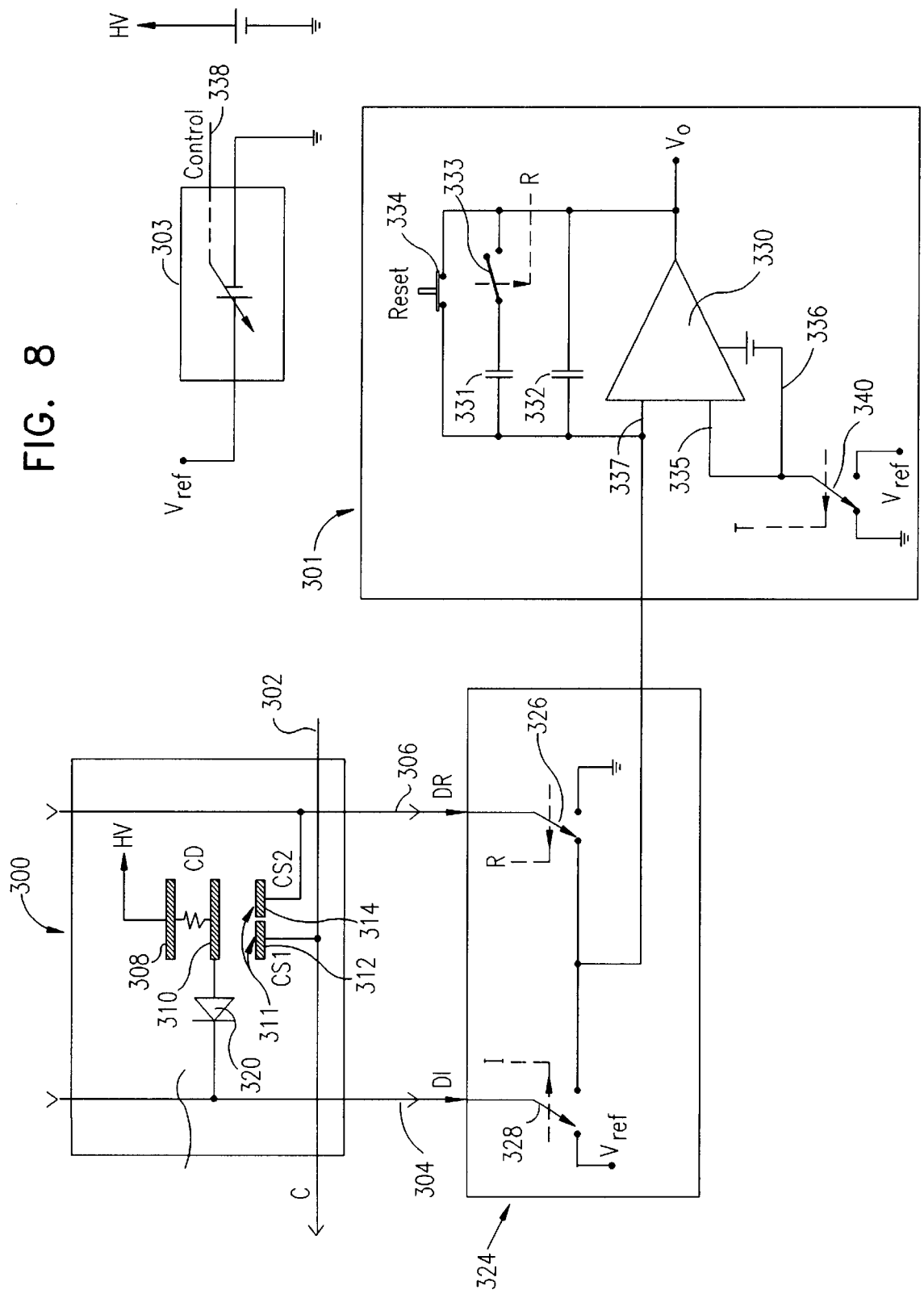
FIG. 8 is a schematic circuit diagram of a basic pixel element and readout electronics associated therewith in accordance with an alternative preferred embodiment of the present invention.

Reference is now made to FIG. 8, which is a schematic circuit diagram of a basic pixel element 300 and channel readout electronics 301 associated therewith as well as an adjustable power supply 303 useful therewith. The structure of FIG. 8 is an alternative to the structure of FIG. 6, described hereinabove. Rows and columns of such pixel elements 300 as well as channel readout electronics 301 are incorporated in a typical X-ray sensor array constructed and operative in accordance with a preferred embodiment of the present invention, such as X-ray sensor array 50 (FIG. 2) of image detection module 30 (FIG. 1) or X-ray sensor array 140 (FIG. 4) of image detection module 130 (FIG. 4).

A basic pixel element 300, which may serve as pixel element 100 (FIG. 3) or pixel element 162 (FIG. 4), provides integrated radiation data and real-time radiation data in accordance with a preferred embodiment of the present invention. Each pixel element 300 preferably has three I/O terminals: an addressing terminal 302, which may correspond to addressing terminal 102 of FIG. 3, an integrated data output terminal 304, which may correspond to integrated data output terminal 104 of FIG. 3, and a real-time radiation data output terminal 306, which may correspond to real-time radiation data output terminal 106 of FIG. 3.

A photoelectric conversion layer (not shown) which may correspond to photoelectric conversion layer 56 (FIG. 2) is disposed between an overlying continuous top electrode 308 which may correspond to top conductive layer 52 (FIG. 2), and a multiplicity of underlying microplates 310 each of which corresponds to a single pixel. A capacitor CD is defined at each pixel between the continuous top electrode 308 and each microplate 310. A pixel charge storage capacitor CS is defined at each pixel between each microplate 310 and an opposing electrode 311, which is preferably segmented into respective electrodes 312 and 314, thus defining capacitances CS1 and CS2. Electrode 314 is preferably connected to line DR via real-time radiation data output terminal 306. Electrode 312 is preferably connected to control line C via addressing terminal 302.

The relationship between capacitors CS and CD is preferably as follows: CS is on the order of two to three orders of magnitude greater than CD. When the capacitance of CS is divided between CS1 and CS2, CS2 is preferably one to two orders of magnitude smaller than CS 1 and is specifically selected in accordance with the macropixel clustering plan described hereinabove with particular reference to FIG. 4 and the desired gain of real-time data readout as described hereinbelow.

Microplate 310 may output charge or current information to line DI from integrated radiation data output terminal 304 via a diode 320, which is preferably a low noise switching diode. It is appreciated that, in the embodiment of FIG. 8, switching diode 320, effectively performs addressing, obviating the need for a low noise transistor as in the embodiment of FIG. 6.

A plurality of pixel elements 300 typically forms a part of a solid state active matrix array of an X-ray sensor array, such as solid state active matrix array 60 (FIG. 2) of X-ray sensor array 50 (FIG. 2) or solid state active matrix array 158 (FIG. 4) of X-ray sensor array 140 (FIG. 4). The precise three-dimensional structure of pixel elements 300 may be in accordance with solid state manufacturing technology, such as that based on standard hydrogenate amorphous silicon (a-Si:H) or polysilicon technology and fabrication techniques as well known in the art, particularly in the field of flat panel displays. Alternatively, the pixel elements 300 may be implemented based on solid state polycrystalline cadmium selenide Ce:Se technology and fabrication processes as known in the art.

As a further alternative, pixel elements 300 may be implemented based on solid state crystalline circuitry as known in the art such that the resulting solid state active matrix array includes a mosaic of inter-connected discrete solid state crystalline circuits, each comprising a plurality of pixel elements 300.

It is understood that each fabricating technology and facility may have a unique approach to implementing the electronic circuitry making up a pixel element 300. Thus, in accordance with a preferred embodiment of the present invention, only the electrical structure of pixel element 300, and not the physical structure thereof, is discussed.

Lines DR and DI, which preferably receive charge signals from macropixels and pixels respectively as described hereinabove with particular reference to FIG. 3, are coupled to a DR/DI selector 324 which may serve as the DR/DI selector 170 of FIG. 4. DR/DI selector preferably includes solid state transistor switches 326 and 328 which receive control signals R and I, respectively, in order to determine whether real-time data from line DR or integrated data from line DI is transferred to channel readout electronics 301, which may represent a single channel of readout electronics 144 (FIG. 4).

Channel readout electronics 301 typically includes a charge amplifier 330 preferably having two integrating capacitors 331 and 332, which are used to provide two distinct gains. A solid state switch 333 is used to disconnect or connect integrating capacitor 331 from charge amplifier 330 in accordance with the desired gain as described below. Charge amplifier 330 is preferably reset using a reset switch 334. It is appreciated that more than two distinct gains may be provided by selecting the number and value of integrating capacitors and switches.

An input 335 of charge amplifier 330, which is preferably a non-inverting input, is preferably connected to a floating common reference 336. A solid state switch 340, triggered by a signal T, is used to switch the floating common reference 336 between ground and Vref.

An input 337 of charge amplifier 330, which is preferably an inverting input, either receives real-time exposure data, in the form of charges, from line DR or integrated data, in the form of charges from line DI. In both cases, charge amplifier 330 provides an output voltage Vo thus providing data readout.

When line DI is connected to input 337, integrated radiation data is input to charge amplifier 330 and read out therefrom. Switch 340 is positioned such that the floating common reference 336 is biased to Vref. In addition, solid state switch 333 is open such that only integrating capacitor 332 is preferably used.

When line DR is connected to input 337, real-time radiation data is input to charge amplifier 330 and read out therefrom. Switch 340 is in a state such that the floating common reference 336 receives a ground potential. Switch 333 is preferably closed so both integrating capacitors 331 and 332 are used thus lowering the gain of the charge amplifier 330.

It is appreciated that each line DR carries data from a macropixel comprising a large number of pixels as described hereinabove with particular reference to FIG. 4. In order to prevent saturation of charge amplifier 330 when line DR is connected to input 337, the readout gain of real-time exposure data from lines DR must be reduced. Lowering the gain is achieved by segmenting opposing electrode 311 into two electrodes 312 and 314 thus dividing CS into two parts CS1 and CS2 as described above, by controlling the ratio between CS1 and CS2 as described above, and by sampling real-time radiation data from CS2 only. Also, the readout gain of charge amplifier 330 may be selected using switch 333 to further reduce the gain and to adjust the desired total readout gain of real-time data.

Channel readout electronics 301 is preferably implemented in ASICS as described hereinabove with particular reference to FIG. 4.

It is appreciated that, as described hereinabove with reference to FIG. 4, DR/DI selector 324 may be implemented as part of a solid state active matrix array or alternatively may be implemented as part of channel readout electronics 301.

Figure 9:
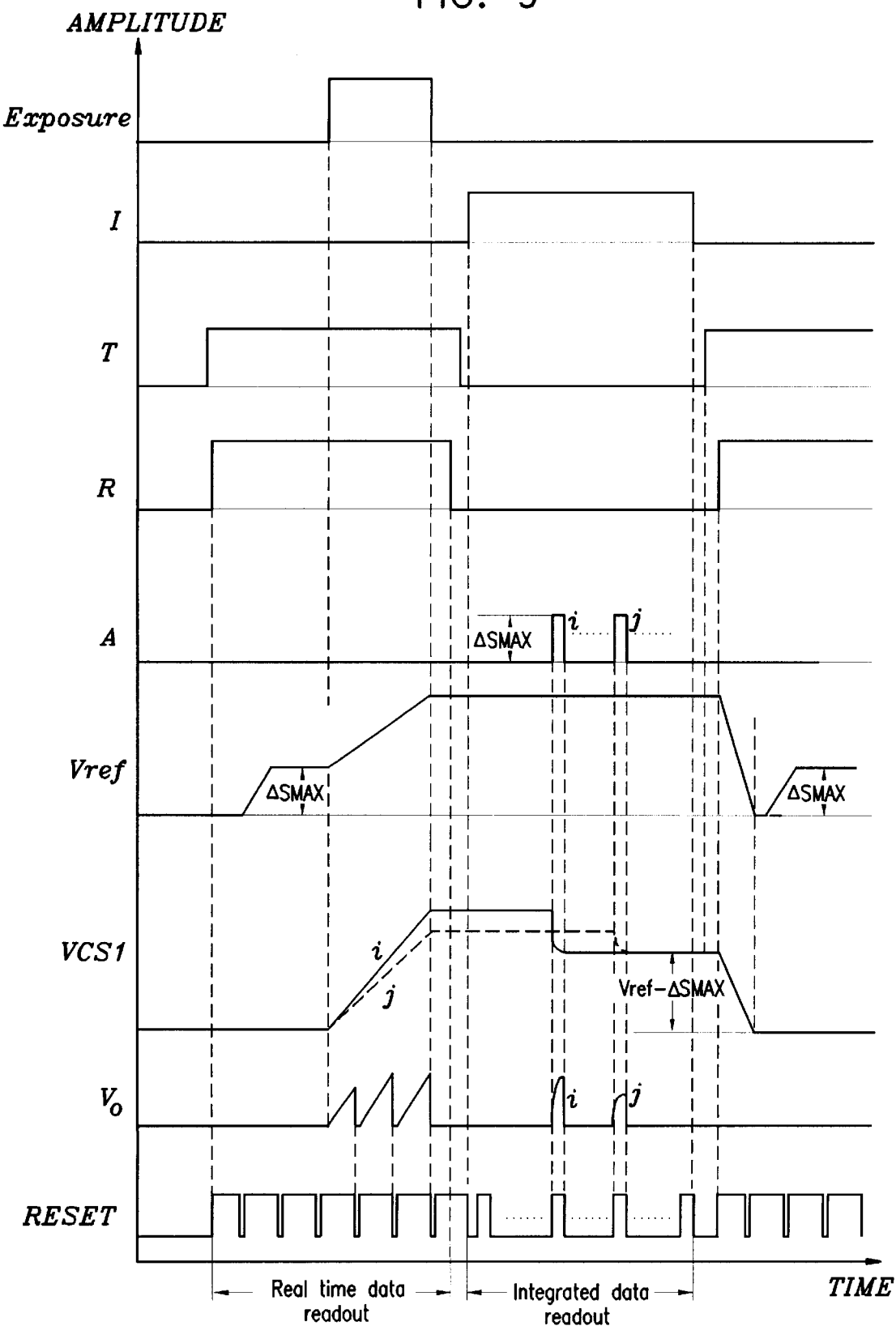
FIG. 9 is a timing diagram that demonstrates the operation of the pixel circuit of FIG. 8 during a readout cycle in accordance with an alternative preferred embodiment of the present invention.

Reference is now made to FIG. 9 which is a timing diagram that demonstrates the operation of the pixel element 300 and channel readout electronics 301 of FIG. 8 during a readout cycle in accordance with an alternative preferred embodiment of the present invention.

As indicated in FIG. 9, a readout cycle typically includes two readout stages: a real-time data readout stage, during which real-time radiation data is read out from lines DR; and an integrated data readout stage, during which a frame of integrated radiation data is read out from lines DI. It is appreciated that in order to provide a frame rate suitable for dynamic imaging applications such as fluoroscopy, all or part of the readout cycle may be repeated periodically at a suitably high rate such as 30 frames of integrated data per second.

Alternatively, for cases when radiation exposure is generally continuous as opposes to exposure pulses, such as with certain types of fluoroscopy, the transition from real-time data readout to integrated data readout may be at predefined time intervals.

It is appreciated that signals I, T, R, A and RESET preferably have an active state and a non-active state. For the explanations herein, the active state is referred to as "high" and the non-active state is referred to as "low".

As indicated in FIG. 8, a high DC voltage HV is applied to top electrode 308 throughout both stages of the readout cycle.

As shown in FIG. 9, with reference to FIG. 8, prior to commencement of the real-time data readout, signal T goes high providing a trigger to switch 340 which causes the floating common reference 336, which is connected to input 335 of charge amplifier 330, to be connected to ground thus connecting electrode 314 to ground.

Just after signal T goes high, at the onset of real-time data readout, and following settling of the ground connection to floating common reference 336, signal R goes high providing a trigger to switch 326 of DR/DI selector 324 thus connecting lines DR to input 337 of charge amplifier 330. Signal R also triggers switch 333 causing integrating capacitor 331 to be connected to charge amplifier 330 to provide an appropriate readout gain. Signal A, applied to control line C, is maintained at a ground potential, so both electrode 312 and electrode 314 via charge amplifier 330 are connected to ground during real-time data readout, while line DI is connected to Vref via switch 328 of DR/DI selector 324.

After signal R goes high, Vref is ramped up from zero to a value of ΔSMAX. The value ΔSMAX is associated with the maximum signal range that can be read out by charge amplifier 330 as described hereinabove with particular reference to vertical dashed line DE of FIGS. 5A and 5B. As a result of the ramping up of Vref, diode 320 becomes reverse biased and non-conducting. Consequently, capacitor CD is charged to a value which is approximately equal to HV plus Vref.

After Vref has settled, radiation exposure begins.

Radiation exposure causes electron/hole pairs to be generated within the photoelectric conversion layer as described hereinabove with particular reference to FIG. 2. Charge carriers that survive recombination are swept along field lines, with charges of one polarity transiting toward top electrode 308 and charges of the opposite polarity transiting toward microplate 310 thereby discharging capacitor CD. The amount of discharge of capacitor CD is a function of the exposure at the area of photoelectric conversion layer corresponding to microplate 310 and the level of dark current occurring thereat.

As a result of discharge of capacitor CD, charge redistribution occurs between top electrode 308 and electrodes 312 and 314, since a potential difference is maintained thereacross by HV and Vref. The charge redistribution causes each pixel storage capacitor CS, corresponding to each pixel element 300, to be charged to a potential VCS which corresponds to the radiation exposure and dark current at that pixel.

It is appreciated that, during exposure and until pixel addressing, the voltage VCS1, at capacitor CS1, and the voltage VCS2, at capacitor CS2, are equal to voltage VCS at capacitor CS. During pixel addressing, VCS1 differs from VCS2. Since VCS1, which is associated with integrated data readout, is more relevant to the data readout cycle, only VCS1 is shown in FIG. 9.

For the purpose of explanation, the potentials VCS1 of two distinct pixels i and j located in two different rows and exposed to different amounts of radiation are shown. It is seen that the potential VCS1 of pixel i rises faster and is greater than the potential VCS1 of pixel j thus indicating that pixel i was exposed to a greater amount of radiation than pixel j.

As is indicated by FIG. 9, simultaneous with the rises of potentials VCS1, the value Vref is adjusted to an increasingly positive value by control signal 338 (FIG. 8) in accordance with an imagewise real-time exposure data processing algorithm as described hereinbelow. It is appreciated that charge redistribution at capacitor CS due to Vref variations is negligible since CD, which is significantly smaller than CS, acquires most Vref variations.

The use of a dynamic Vref value is a special feature of a preferred embodiment of the present invention. Adjusting the value Vref allows the maximum value of VCS1 at each pixel element 300, and thus the maximum amount of X-ray radiation that can be detected before saturation of the X-ray sensor array 140 (FIG. 4), to be dynamic and to be a function of the emerging X-ray image. Typically, high VCS1 potentials occur at pixels which receive high amounts of radiation, such as pixels that receive direct, unattenuated X-ray exposure. By adjusting Vref, the dynamic range of the X-ray sensor array 140 (FIG. 4) is increased.

In accordance with a preferred embodiment of the present invention, saturation of pixels of the X-ray sensor array 140 (FIG. 4) occurs only when the combined value, Vref–VCS, of such pixels becomes positive relative to ground. At saturation, diode 320 of the saturated pixels becomes forward biased and begins conducting, causing excess charge accumulated on microplate 310 to be leaked and drained off through line DI.

An advantage of draining off excess charge through diode 320 is that voltage overloads to active elements of pixel circuits are prevented. The problem of voltage overloads in pixel circuits is well known in the art and leads to circuitry breakdown.

During real-time radiation data readout, charge amplifier 330, outputs a value Vo which corresponds to the amount of radiation exposure at a macropixel including a group of pixel elements 300 in the following manner:

As a result of charge redistribution, charge flows to and accumulates at electrodes 312 and 314, thus mirroring the charge which was swept to microplate 310 and accumulated thereat during exposure. Charge flowing to electrode 314, which is a sampling of the total charge flowing into CS, flows through charge amplifier 330.

Charge amplifier 330 integrates the charge flowing to all electrodes 314 of a macropixel through line DR and provides the output value Vo which corresponds to the real-time exposure value at a macropixel as described hereinabove.

Preferably, the output value Vo is reset by a RESET signal which triggers reset switch 334 at a predetermined rate which preferably remains fixed during real-time radiation data readout and which is determined as described hereinbelow with particular reference to FIG. 10. Resetting the output value Vo prevents saturation of charge amplifier 330 during real-time radiation data readout, thus allowing the same charge amplifier 330 to be used for readout of integrated data as well as readout of real-time radiation data.

Following termination of exposure, signal R goes low as shown in FIG. 9, triggering switch 326 which causes line DR to be disconnected from input 337 of charge amplifier 330 and to be connected directly to ground. Signal R also triggers switch 333, disconnecting integrating capacitor 331 from charge amplifier 330, thus increasing the gain of charge amplifier 330.

After signal R goes low, signal T goes low, providing a trigger to switch 340 which causes floating common reference 336 to connect to Vref.

After settling of Vref at floating common reference 336, signal I goes high providing a trigger to switch 328, causing line DI to be connected to input 337 of charge amplifier 330. Integrated data readout starts through row-by row addressing by signal A, which sequentially addresses control lines C, at a predefined addressing rate. To address a row, signal A is steeply ramped to a value of ΔSMAX, causing diodes 320 of pixel elements 300 in the addressed row to become forward biased. It is appreciated that Vref remains fixed during integrated data readout.

In addressed pixels, charge accumulated at capacitor CS1 during exposure flows from microplates 310 to charge amplifier 330 via line DI. As a result of this charge flow, the potential VCS1 of a pixel element 300 in the addressed row is reduced to a value (Vref–ΔSMAX), below which diode 320 become reverse biased and non-conducting, thus preventing further charge flow from microplates 310. Charge amplifiers 330 integrate the flowing charge and output voltage values Vo.

It is appreciated that in the integrated data readout stage, each output value Vo of charge amplifier 330 preferably corresponds to the data of a single pixel.

As seen in FIG. 9, the integrated data from the row containing pixel i is addressed and thus outputs integrated data associated therewith before the row containing pixel j.

It is a particular feature of the present invention that the output value Vo represents only a fraction of the potential VCS1. The remainder of potential VCS1 represents a DC component which does not bear any image information as described hereinabove with particular reference to FIGS. 5A and 5B. Charge associated with the DC component, which does not contribute image information is factored out. By factoring out the DC component, the histogram associated with the X-ray image is translated thus providing an automatic tone scale remapping function for the X-ray image being read as described hereinabove with reference to FIG. 5B.

The RESET signal is a trigger for reset of charge amplifiers 330 which is provided during integrated data readout at a predetermined triggering rate. Typically the predetermined triggering rate is associated with the desired row addressing and frame readout rates and is different than the triggering rate used during real time data readout.

Charge is read out from all rows through sequential addressing via control lines C to provide a frame of integrated data representing an X-ray image. Immediately after charge is read out from the final row, signal I goes low providing a trigger to switch 328 which causes line DI to be disconnected from input 337 of charge amplifier 330 and to be connected to ground.

After signal I causes disconnection of line DI, signal T goes high providing a trigger to switch 340 causing Vref to be connected to floating common reference 336.

After Vref is settled at floating common reference 336, signal R goes high providing a trigger to switch 326 causing lines DR to be connected to input 337 of charge amplifier 330. Signal R also causes switch 333 to be closed thus reducing the gain of charge amplifier 330.

After signal R goes high, Vref is ramped down to zero causing diode 320 to be forward biased and conducting. Ramping down Vref causes full discharge of capacitor CS and reduction of VCS to its minimum value. It is appreciated that charge from CS1, which is associated with the DC component and therefore was not read during integrated data readout, and charge from CS2 is leaked at this time from microplate 310 through diode 320 along lines DI to Vref, which is at ground potential at this time.

After full discharge of capacitor CS of each pixel element 300, the system is ready for a subsequent real time data readout cycle.

Figure 10:
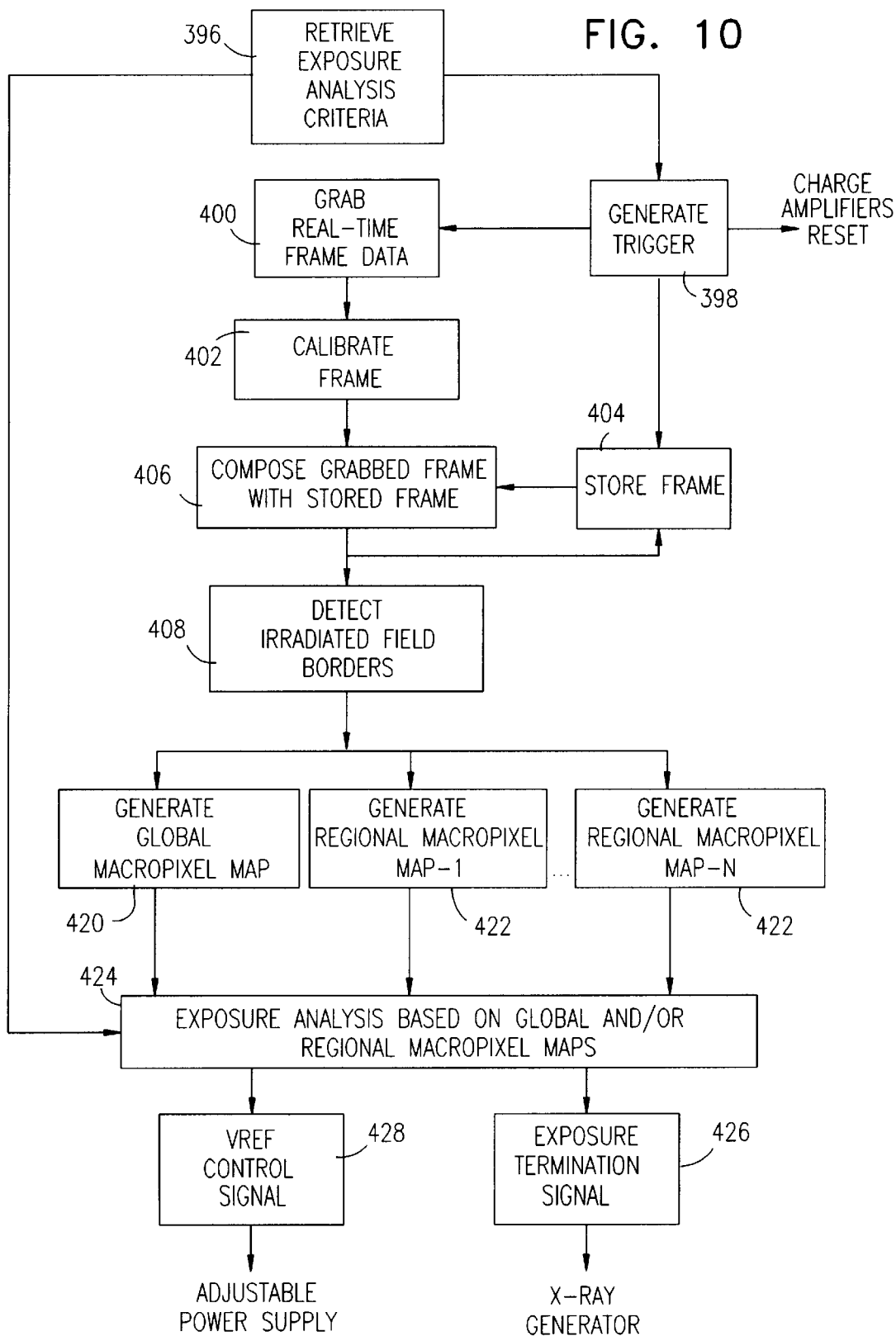
FIG. 10 is a block diagram illustrating the steps of an algorithm for processing imagewise real-time exposure data in accordance with a preferred embodiment of the present invention.

Reference is now made to FIG. 10 which is a block diagram illustrating the steps of an algorithm for processing imagewise real-time exposure data to provide improved dose control and a Vref value in accordance with a preferred embodiment of the present invention. The Vref value, as described hereinabove provides expansion of the effective dynamic range of radiation detection and an automatic tone scale remapping function for an X-ray image.

It is appreciated that the algorithm described herein is executed during X-ray exposure by the real-time section of the data processor residing in system host computer 34 (FIG. 1). Exposure analysis criteria associated with the various types of examinations that are typically carried out in general radiography are stored in an examination library database in system host computer 34 (FIG. 1) and may be periodically updated.

Before exposure, exposure analysis criteria associated with the specific examination to be carried out are preferably retrieved from the examination library database as indicated by block 396. The exposure analysis criteria retrieved from the examination library database correspond to the type of examination to be carried out and details thereof such as anatomic region, patient build, etc.

Based on the retrieved exposure analysis criteria, a trigger for frame grabbing and readout reset is generated as indicated by block 398 at a given rate. An output trigger is also provided, at a given rate, for the RESET signal as described hereinabove with particular reference to FIGS. 7 and 9.

The RESET triggering rate is preferably a function of the maximum expected exposure duration which is retrieved as part of the exposure analysis criteria. For processing of real-time exposure data, it is preferable to "grab" a generally steady number of frames, irrespective of the duration of exposure. Thus, when the maximum expected exposure is shorter, the triggering rate is typically increased in order to grab a suitable number of frames.

The RESET rate is determined based on the maximum expected exposure duration and the dynamic range of the charge amplifiers of the readout electronics to prevent readout saturation during exposure as described hereinabove.

During exposure, frame-by-frame grabbing of real-time exposure data occurs as indicated by block 400. Each frame preferably comprises the real-time exposure data, in the form of charges, from all macropixels of the image detection module 30 (FIG. 1) that have accumulated since the previous readout reset as described hereinabove with particular reference to FIGS. 7 and 9.

As indicated in block 402, grabbed data is calibrated to compensate for offsets and gain variations in a manner known in the art. At each readout RESET, the previously grabbed frame of sampled real-time exposure data is stored as indicated in block 404.

As indicated in block 406, with each new frame that is grabbed, a composing function is carried out combining the latest grabbed frame with the stored frame information.

The composed data frame, emerging during exposure, is used for detection of irradiated field borders as indicated in block 408.

The irradiated field is a preferably rectangular area of the image detection module 30 (FIG. 1) upon which primary X-ray radiation, modulated by the object to be imaged, directly impinges.

The borders of the irradiated field are adjustable and are typically defined by collimator 24 (FIG. 1) in accordance with the region of interest which is being imaged such that the irradiated field contains the entire region of interest. In addition, the irradiated field may include background regions which receive maximum exposure that are typically background regions upon which non-attenuated X-ray impinged (no object).

It is appreciated that secondary X-ray radiation, produced by radiation scatter from the object being imaged is not limited by the collimator. Radiation scatter which may be reduced using the anti-scatter grid 32 (FIG. 1), typically impinges upon the image detection module 30 (FIG. 1) within and beyond the borders of the irradiated field. As a result of this scatter, the minimum exposure value inside the irradiated field corresponding to the object's maximum attenuation may in some cases be lower than the exposure values outside of the irradiated field borders.

The border detection approach described in accordance with the present invention is based upon detection of the maximum exposure value along each row and each column of image detection module 30 (FIG. 1). Rows and columns which do not traverse the irradiated field have significantly lower maximum exposure values than rows and columns which do traverse the irradiated field.

Figure 11:
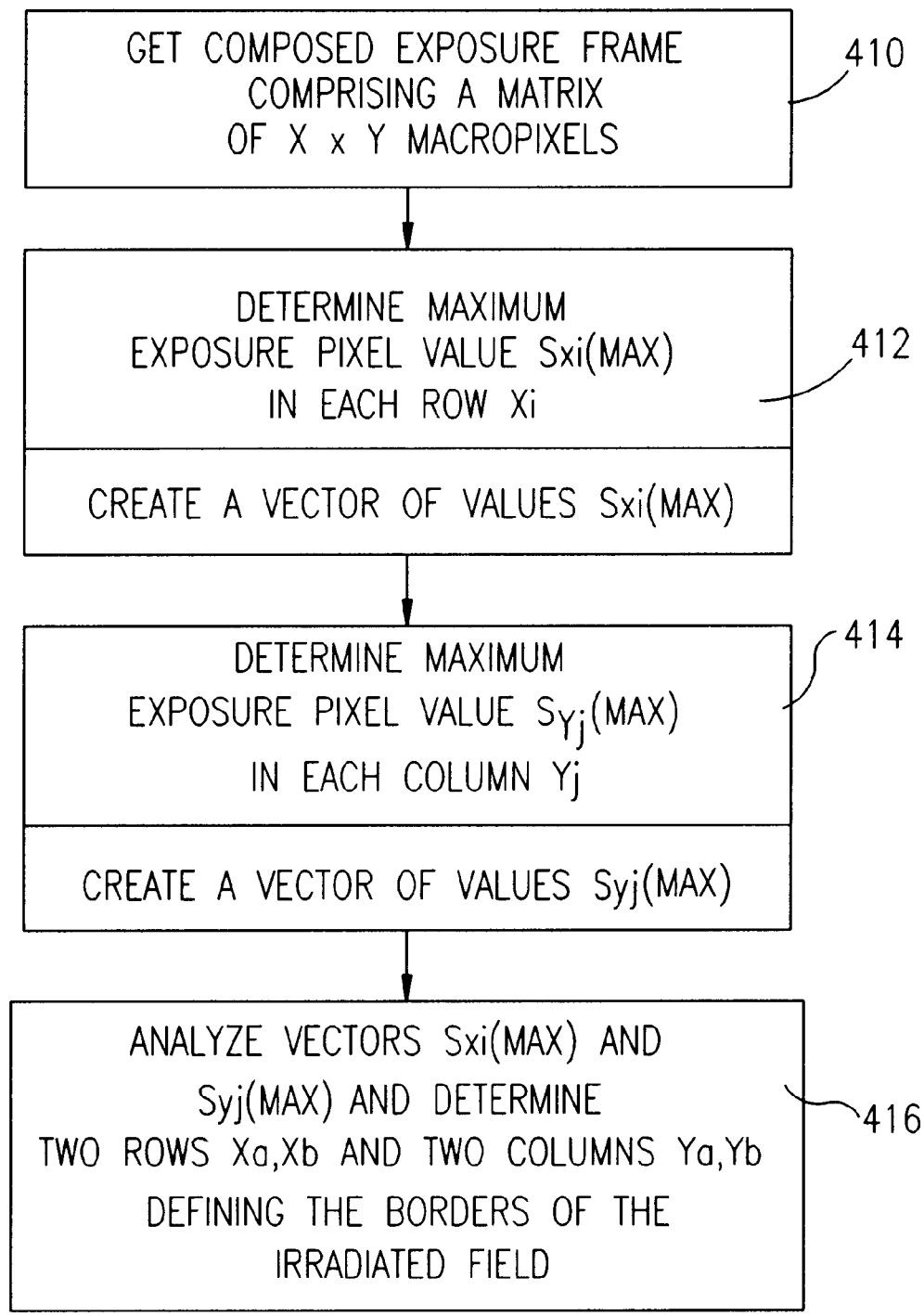
FIG. 11 is a block diagram showing the steps of detection of irradiated field borders in accordance with a preferred embodiment of the present invention.

The detection of irradiated field borders shown in block 408 may be understood by additional reference to FIG. 11 which describes in detail the steps of detection of irradiated field borders in accordance with a preferred embodiment of the present invention.

Additional reference is also made to FIG. 12A and FIG. 12B which are graphical illustrations useful in understanding the border detection steps in accordance with a preferred embodiment of the present invention.

As seen in FIG. 11, a composed data frame as described hereinabove, preferably comprising a matrix of X by Y macropixels, is loaded as indicated in block 410. Preferably, the product of X and Y equals the total number of macropixels M.

Following loading, the exposure value of each macropixel of each row i is evaluated to determine the maximum exposure value $S_{xi}(MAX)$ for the row i. The maximum exposure values of all rows are calculated to create a vector comprising the $S_{xi}(MAX)$ values for all rows as indicated by block 412. The values of the sample resulting vector are shown in FIG. 12A.

Following evaluation, the exposure value of each macropixel of each column j is evaluated to determine the maximum exposure value $S_{yj}(MAX)$ for the column j. The maximum exposure values of all columns are calculated to create a vector comprising the $S_{yj}(MAX)$ values for all columns as indicated by block 414. The values of the sample resulting vector is shown in FIG. 12B.

Each vector $S_{xi}(MAX)$ and $S_{yj}(MAX)$ is analyzed according to a threshold discrimination criterion, element by element, from the first vector element to the last element and from its last element to its first element in order to determine the two rows Xa and Xb and two columns Ya and Yb at which the predefined threshold is crossed, thereby defining borders of the irradiated field as indicated by block 416 and shown in FIG. 11. It is appreciated that each border defining the irradiated field is preferably determined with a positional accuracy of +/−one macropixel.

Various approaches to determining the threshold discrimination criterion can be implemented such as using the vector maximum value or averaged maximum peak values to provide a dose normalized threshold. Alternatively, other methods for determining the irradiated field during exposure may be implemented.

Typically in general radiography, the active area of the image detection module 30 (FIG. 1) is fixed at 17"×17". As known, examinations require a variety of smaller imaging areas, that with screen/film systems would be achieved by using a smaller cassette or by positioning the cassette for landscape or portrait imaging. With digital imaging, the ability to determine the irradiated field borders and to then exclude data from areas that are outside the field borders and thus non-relevant, provides better accuracy in data analysis as described hereinbelow.

In the illustration of FIG. 12C, a global cluster of macropixels making up the irradiated field is indicated by reference numeral 418. Reference numerals 419 indicate regional clusters of macropixels within the borders of the irradiated field as described hereinbelow with reference to FIG. 10. It is appreciated that global cluster 418 is typically used for histogram analysis and that the regional clusters 419 are typically used for density analysis as described hereinbelow.

Referring back to FIG. 10, the step following determination of the irradiated field borders is the creation of a global macropixel map as indicated by block 420 and regional macropixel maps as indicated by blocks 422.

The global macropixel map contains the exposure tone values of all macropixels within global cluster 418 (FIG. 12C), while the regional macropixel maps contain the exposure tone values of regional clusters 419 (FIG. 12C).

The locations of regional clusters 419 (FIG. 12C) may be fixed with respect to the image detection module 30 (FIG. 1). Alternatively or additionally, the locations of regional clusters 419 (FIG. 12C) may be adjustable with respect to the irradiated field origin.

The macropixels selected to form a regional cluster 419 (FIG. 12C) may be determined in accordance with the exposure analysis criteria according to the type of examination to be carried out, as shown in block 396. Thus, each examination type may be associated with a unique regional cluster scheme which provides higher accuracy of exposure sensing for that specific examination.

During exposure, the global and/or one or more of the regional macropixel maps are comparatively analyzed as indicated by block 424 with respect to exposure analysis criteria retrieved from the examination library in accordance with the examination to be carried out as indicated by block 396. For example, the analysis may be based upon histogram comparison to provide an exposure duration at which the image contrast in the region of interest reaches an acceptable value for diagnostic purposes. When the desired contrast level is reached, exposure is preferably terminated by sending an exposure termination signal to X-ray generator 40 (FIG. 1) as indicated by block 426. Alternatively, when exposure parameters are input to the console (not shown) of X-ray generator 40 (FIG. 1), the exposure termination signal does not control the X-ray generator 40 (FIG. 1) and termination is carried out in a conventional manner not based on the exposure termination signal.

The duration of the actual exposure, which is typically shorter than the maximum expected exposure time discussed hereinabove is controlled by the output of the algorithm, thus providing dose control also known as automatic exposure control. It is appreciated that in no event will the duration of actual exposure be allowed to exceed the maximum expected exposure time in order to ensure safe operation of the imaging system.

In accordance with a preferred embodiment of the present invention, imagewise exposure data is available in real time and thus suitable known methods for real-time image analysis to determine image contrast of the global macropixel map and/or density levels of the regional macropixel maps may be implemented in a preferred embodiment of the present invention and used for automatic exposure control.

In addition to exposure control, the histogram of the global macropixel map may be analyzed to determine a dynamic minimum exposure level within the irradiated field as described hereinabove with reference to FIGS. 5A and 5B. The minimum exposure level, at any given time during the X-ray exposure, is used to control and set the value of Vref as indicated by block 428. The Vref control is output to the adjustable power supply 203 (FIG. 6) or adjustable power supply 303 (FIG. 8) to dynamically adjust the value of Vref thereby factoring out the DC component from the emerging X-ray image, thus expanding the dynamic range of radiation detection and providing an automatic tone scale remapping function for X-ray image readout and post-processing as described hereinabove.

It is appreciated that during X-ray image readout from prior art solid state digital X-ray devices, significant image processing of raw data is typically required in order to generate an image that can be displayed or printed. The amount of image processing is significant due to the quantity of basic pixels to be processed and the number of bits associated with each pixel, typically 12 to 16 bits.

In accordance with a preferred embodiment of the present invention, post-exposure X-ray image readout and image processing is simplified due to the fact that the irradiated field borders are detected during exposure thus allowing pixels outside of the irradiated field to be disregarded during image readout and post-processing. The image processing is further simplified and thus accelerated due to the automatic tone scale remapping which occurs via the mechanism of Vref. It is appreciated that, as described hereinabove, when using Vref to provide tone scale remapping, the number of bits per pixel used when converting the analog X-ray image to a digital X-ray image may be reduced to 8 bits.

It will be appreciated by persons skilled in the art that the present invention is not limited by what has been described above. The scope of the present invention includes both combinations and sub-combinations of the various features described hereinabove as well as modifications and additions thereto which would occur to a person skilled in the art upon reading the foregoing disclosure and which are not in the prior art.

What is claimed is:

1. A radiation imager comprising:
   a plurality of radiation sensing elements operative to provide real-time radiation data and integrated radiation data; and
   circuitry coupled to said plurality of radiation sensing elements and providing readout of said real time radiation data and readout of said integrated radiation data and being operative to employ said integrated radiation data to provide a radiation image.

2. A radiation imager according to claim 1 and wherein said plurality of radiation sensing elements includes at least one first grouping of said plurality of radiation sensing elements employed for real-time radiation sensing at at least one spatial resolution and at least one second grouping of radiation sensing elements employed for integration radiation sensing at at least another spatial resolution.

3. A radiation sensing device having a plurality of cells, each of said cells including:
   a radiation sensor;
   a first output terminal, connected to the radiation sensor, which outputs real-time radiation data sensed by said radiation sensor;
   an input terminal, connected to said radiation sensor, which is employed to address said radiation sensor; and
   a second output terminal, connected to said radiation sensor, which outputs integrated radiation data sensed by said radiation sensor when addressed.

4. A radiation sensing device according to claim 3 and wherein said plurality of cells are arranged in a matrix array having cluster, row and column connections and whereby:
   the first output terminals of cells in a cluster are connected to a common cluster data output line;
   the addressing input terminals of cells in a row are electrically connected to a common row addressing line; and
   the second output terminals of cells in a column are connected to a common column data output line.

5. A radiation sensing device according to claim 4 and wherein the number of clusters is generally equal to the number of columns.

6. A radiation sensing device according to claim 4 and further comprising circuitry for data readout.

7. A radiation sensing device according to claim 5 and further comprising circuitry for data readout and a solid state switch operative to select between data from said clusters and data from said columns.

8. A radiation sensing device according to claim 4 and wherein
real-time radiation data is read out at a first spatial resolution concurrently from said cluster data output lines; and
integrated radiation data is read out at a second spatial resolution from said common column data output lines via sequential row-by-row matrix addressing of said common row addressing lines.

9. A radiation sensing device according to claim 8 wherein the real-time radiation data is employed for automatic exposure control.

10. A radiation sensing device according to claim 3 wherein said radiation sensed is ionizing radiation.

11. A radiation sensing device according to claim 10 wherein the ionizing radiation is X-ray radiation.

12. A solid state radiation imager comprising: a plate electrode;
a photoelectric conversion layer underlying said electrode and being operative to convert radiation passing through said plate electrode and impinging on said layer to charge carriers;
a solid state active matrix array underlying said photoelectric conversion layer and including a plurality of pixel capacitors which are operative to accumulate said charge carriers, each pixel capacitor including:
an addressable microplate; and
a segmented opposing electrode;
control circuitry for selective addressing of said addressable microplates; and
readout circuitry for sensing charge flowing to at least one segment of said opposing electrodes, thereby providing real-time exposure information, and sensing accumulated charge from addressed ones of said addressable microplates, thereby providing integrated radiation information associated with said radiation.

13. A solid state radiation imager according to claim 12 and wherein the segmented opposing electrodes are each divided into at least two different segments associated with at least two different capacitances and wherein the capacitance associated with the at least one segment from which charge flowing is sensed is one to two orders of magnitude smaller than the capacitance associated with other ones of the at least two segments.

14. A solid state radiation imager according to claim 12 and also comprising switching low noise transistors, each operative to address one of said addressable microplates.

15. A solid state radiation imager according to claim 14 and also comprising a diode in series with each switching low noise transistor and wherein said diode is operative generally to prevent excess charge accumulation at each pixel capacitor and to prevent circuitry breakdown.

16. A solid state radiation imager according to claim 12 and also comprising switching diodes, each operative to address one of said addressable microplates and generally to prevent excess charge accumulation at each pixel capacitor and to prevent circuitry breakdown.

17. A solid state radiation imager according to claim 12 and further including a solid state selector for selecting whether charge flowing to said at least one segment of said opposing electrodes or accumulated charge from said addressed ones of said addressable microplates is sensed by the readout circuitry.

18. A solid state radiation imager according to claim 17 and wherein said readout circuitry defines at least a first gain value for read out of charge flowing to at least one segment of said opposing electrodes and at least a second gain value for read out of accumulated charge from said addressed ones of said addressable microplates.

19. A solid state radiation imager according to claim 12 and wherein said readout circuitry includes first dedicated readout circuitry operative for sensing charge flowing to at least one segment of said opposing electrodes and second dedicated readout circuitry operative for sensing accumulated charge from said addressed ones of said addressable microplates.

20. A solid state radiation imager according to claim 12 wherein the impinging radiation is ionizing radiation.

21. A solid state radiation imager according to claim 20 wherein the ionizing radiation is X-ray radiation.

22. A solid state radiation imager according to claim 12 and wherein the photoelectric conversion layer includes a photoconductor and charge blocking layers overlying and underlying said photoconductor.

23. A solid state radiation imager according to claim 22 and wherein the charge blocking layers have opposing unipolar charge blocking characteristics.

24. A solid state radiation imager according to claim 22 and wherein the photoconductor is formed of at least one of amorphous selenium and a selenium alloy.

25. A solid state radiation imager according to claim 22 wherein the photoconductor is formed of a material selected from the group consisting of lead iodide, lead oxide thallium bromide, cadmium telluride, cadmium zinc telluride, cadmium sulfide, and mercury iodide.

26. A solid state imager according to claim 12 and wherein the real-time exposure information is generally imagewise.

27. A solid state radiation imager according to claim 12 and also comprising a controllable X-ray source.

28. A solid state imager according to claim 27 and wherein the real-time exposure information is used to control termination of radiation exposure from said controllable X-ray source.

29. A solid state imager according to claim 12 and employing an adjustable reference bias potential to factor out a uniform component from the integrated charge accumulated at said plurality of pixel capacitors.

30. A solid state radiation imager according to claim 29 and wherein said real-time exposure information is used to dynamically adjust the reference bias potential.

31. A solid state radiation imager according to claim 30 wherein dynamic adjustment of the reference bias potential automatically factors out in real-time a DC component from a sensed radiation image thereby expanding the dynamic range of the solid state radiation imager.

32. A solid state radiation imager according to claim 30 wherein dynamic adjustment of the reference bias potential automatically provides tone scale remapping of the integrated radiation information.

33. A method for automatic exposure control in an X-ray system and comprising the steps of:
providing a radiation detector including an array of image pixels underlying an object to be imaged;

irradiating the object to be imaged;

detecting at the radiation detector in real-time an irradiated field spanning at least some of the image pixels;

employing the detected irradiated field to determine at least one local region;

generating a regional pixel map for each of said at least one local region, wherein each regional pixel map comprises exposure values of image pixels contained within the corresponding local region; and repeatedly analyzing the regional pixel maps using associated analysis criteria to determine timing for exposure termination; and providing an exposure termination signal.

34. A method for automatic exposure control in an X-ray system according to claim 33 and wherein local regions, corresponding regional pixel maps and analysis criteria associated therewith are selected in accordance with a specific diagnostic examination.

35. A method for imagewise radiation detection comprising the steps of:

providing a controllable ionizing radiation source;

providing an image detection module having a plurality of sensing elements;

positioning an object to be imaged between said controllable ionizing radiation source and said image detection module;

exposing said object to be imaged to radiation emitted by said controllable ionizing radiation source;

generally continuously providing real-time data from said plurality of sensing elements corresponding to radiation impinging on said image detection module during exposure;

integrating data at said plurality of sensing elements to provide integrated data corresponding to an integrated level of radiation impinging on said image detection module;

real-time processing of said real-time data to provide feedback to said image detection module; and processing said integrated data to provide a digital image representation corresponding to said object to be imaged.

36. A method according to claim 35 and wherein said feedback is employed to provide a termination signal to the controllable ionizing radiation source, thus providing automatic exposure control.

37. A method according to claim 35 and wherein said feedback is employed for factoring out a component from said integrated data which does not generally contain information relating to the object being imaged, thus providing an expanded dynamic range for the image detection module.

38. A method according to claim 37 and wherein said factoring out step provides tone scale remapping of the integrated data.

39. A method according to claim 37 and wherein said factoring out step provides increased dark current tolerance for the image detection module.

40. A method according to claim 35 wherein the integrated data is not attenuated by the sensing of the real-time data.

41. A method for enhanced detection of radiation images comprising the steps of:

providing a radiation image detector including an array of image pixels underlying an object to be imaged;

irradiating the object to be imaged;

detecting at said image detector in real-time an irradiated field spanning at least some of the image pixels;

employing the detected irradiated field to determine a global pixel map comprising exposure values of image pixels contained within the irradiated field;

repeatedly analyzing the global pixel map using associated analysis criteria to provide feedback to the radiation image detector; and employing the feedback for enhanced detection of radiation images.

42. A method for enhanced detection of radiation images according to claim 41 and wherein the step of repeatedly analyzing the global pixel map includes the steps of repeatedly creating a histogram distribution of the number of pixels versus exposure values and imagewise analyzing of the histogram distribution.

43. A method according to claim 41 and wherein the feedback to the radiation image detector is employed to provide an exposure termination output.

* * * * *